US010887537B1

(12) United States Patent
Mohammed

(10) Patent No.: US 10,887,537 B1
(45) Date of Patent: Jan. 5, 2021

(54) COMPRESSIVE SENSING BASED IMAGE CAPTURE USING DYNAMIC MASKING

(71) Applicant: Perceive Corporation, San Jose, CA (US)

(72) Inventor: Ilyas Mohammed, San Jose, CA (US)

(73) Assignee: PERCEIVE CORPORATION, San Jose, CA (US)

( * ) Notice: Subject to any disclaimer, the term of this patent is extended or adjusted under 35 U.S.C. 154(b) by 0 days.

(21) Appl. No.: 16/246,142

(22) Filed: Jan. 11, 2019

Related U.S. Application Data

(60) Provisional application No. 62/756,037, filed on Nov. 5, 2018, provisional application No. 62/720,647, filed on Aug. 21, 2018.

(51) Int. Cl.
*H04N 5/374* (2011.01)
*G06T 5/00* (2006.01)
*G01S 3/783* (2006.01)
*H01L 27/146* (2006.01)
*G06T 7/55* (2017.01)
(Continued)

(52) U.S. Cl.
CPC ....... *H04N 5/3745* (2013.01); *G02B 26/0833* (2013.01); *H01L 27/14601* (2013.01)

(58) Field of Classification Search
CPC .... H04N 5/3745; H04N 13/00; H04N 13/246; H04N 19/129; H04N 19/18; H04N 19/184; H04N 19/186; H04N 19/645; G06T 7/85; G06T 7/55; G06T 7/521; G06T 2209/00;
(Continued)

(56) References Cited

U.S. PATENT DOCUMENTS 6,735,253 B1 * 5/2004 Chang .................. H04N 7/18
375/240.16
7,532,772 B2 5/2009 Brady
(Continued)

OTHER PUBLICATIONS

Asif, M. Salman, et al., "FlatCam: Thin, Bare-Sensor Cameras using Coded Aperture and Computation," IEEE Transactions on Computational Imaging, Jul. 20, 2016,12 pages, vol. 3—Issue 3, IEEE, Piscataway, NJ, USA.
(Continued)

*Primary Examiner* — Marly S Camargo
(74) *Attorney, Agent, or Firm* — Adeli LLP

(57) ABSTRACT

Some embodiments provide a novel compressive-sensing image capture device and a method of using data captured by the compressive-sensing image capture device. The novel compressive-sensing image capture device includes an array of sensors for detecting electromagnetic radiation. Each sensor in the sensor array has an associated mask that blocks electromagnetic radiation from portions of the sensor. In some embodiments, an array of passive masks is used to block a particular set of areas of each sensor in the sensor array. In some embodiments, the image capture device also includes an array of lenses corresponding to the sensors of the sensor array such that each sensor receives light that passes through a different lens. Some embodiments of the invention provide a dynamic mask array. In some embodiments, a novel machine trained network is provided that processes image capture data captured by the compressive-sensing image capture device to predict solutions to problems.

16 Claims, 26 Drawing Sheets

(51) Int. Cl.
*H04N 5/3745* (2011.01)
*G02B 26/08* (2006.01)

(58) Field of Classification Search
CPC ... G06T 5/004; G06T 9/481; H01L 27/14601; G02B 26/0833; G01S 3/7835
USPC ......... 348/308, 241, 251, 229.1, 259, 14.13, 348/439.1, 568, 661; 382/144, 212, 213, 382/283, 274, 275, 232, 166, 233, 235, 382/243, 244; 375/240.25, 375/240.11–240.29; 345/626, 563, 165, 345/556
See application file for complete search history.

(56) References Cited

U.S. PATENT DOCUMENTS

| | | | |
|---|---|---|---|
| 9,383,548 B2 | 7/2016 | Lansel | |
| 9,983,259 B2* | 5/2018 | Wu et al. | G01J 3/2823 250/338.1 |
| 10,091,440 B1* | 10/2018 | Murphy | H04N 5/33 348/294 |
| 10,179,274 B2* | 1/2019 | Stevens | H01J 37/222 250/311 |
| 2002/0001759 A1* | 1/2002 | Ohashi | G06F 9/00 430/5 |
| 2006/0157640 A1* | 7/2006 | Perlman | H04N 5/2254 250/208.1 |
| 2007/0097235 A1* | 5/2007 | Milller | H04N 5/217 348/241 |
| 2008/0025624 A1* | 1/2008 | Brady | G06K 9/40 382/233 |
| 2012/0162457 A1 | 6/2012 | Veeraraghavan et al. | |
| 2013/0011051 A1* | 1/2013 | Battisti | G06K 9/6244 382/159 |
| 2013/0301742 A1* | 11/2013 | Guo | G06K 9/40 375/240.26 |
| 2014/0078352 A1* | 3/2014 | Iwai | H04N 5/217 348/241 |
| 2015/0003738 A1* | 1/2015 | Bernal | G06K 9/6249 382/195 |
| 2015/0003750 A1 | 1/2015 | Bernal et al. | |
| 2015/0070555 A1* | 3/2015 | Guicquero | H04N 5/3745 348/308 |
| 2017/0025247 A1* | 1/2017 | Stevens | H01J 37/222 250/311 |
| 2017/0041571 A1* | 2/2017 | Tyrrelll | H04N 7/183 348/302 |
| 2017/0082263 A1 | 3/2017 | Byrnes et al. | |
| 2017/0357856 A1 | 12/2017 | Hu et al. | |
| 2017/0366763 A1 | 12/2017 | Lin et al. | |
| 2018/0115774 A1* | 4/2018 | Su | H04N 11/02 375/240.03 |
| 2018/0260649 A1 | 9/2018 | Kadambe et al. | |
| 2019/0340497 A1 | 11/2019 | Baraniuk et al. | |
| 2019/0353887 A1 | 11/2019 | Riza | |

OTHER PUBLICATIONS

Candès, Emmanuel J., et al., "An Introduction to Compressive Sampling," IEEE Signal Processing Magazine, Mar. 2008, 10 pages, IEEE, Piscataway, NJ, USA.
Huang, Gang, et al., "Lensless Imaging by Compressive Sensing," 2013 IEEE International Conference on Image Processing, Sep. 15-18, 2013, 5 pages, IEEE, Melbourne, VIC, Australia.
Non-Published Commonly Owned U.S. Appl. No. 15/671,105, filed Aug. 7, 2017, 30 pages, Perceive Corporation.
Non-Published Commonly Owned U.S. Appl. No. 16/246,112, filed Jan. 11, 2019, 64 pages, Perceive Corporation.
Non-Published Commonly Owned U.S. Appl. No. 16/246,130, filed Jan. 11, 2019, 64 pages, Perceive Corporation.
Non-Published Commonly Owned U.S. Appl. No. 16/246,150, filed Jan. 11, 2019, 64 pages, Perceive Corporation.
Non-Published Commonly Owned U.S. Appl. No. 16/246,182, filed Jan. 11, 2019, 64 pages, Perceive Corporation.
Non-Published Commonly Owned U.S. Appl. No. 16/246,191, filed Jan. 11, 2019, 63 pages, Perceive Corporation.
Romberg, Justin, "Imaging via Compressive Sampling," IEEE Signal Processing Magazine, Mar. 2008, 7 pages, vol. 25—Issue 2, IEEE, Piscataway, NJ, USA.
Stork, David G., et al., "Lensless Ultra-Miniature CMOS Computational Imagers and Sensors," The Seventh International Conference on Sensor Technologies and Applications (SENSORCOMM '13), Aug. 25-31, 2013, 6 pages, IARIA XPS Press, Barcelona, Spain.

* cited by examiner

COMPRESSIVE SENSING BASED IMAGE CAPTURE USING DYNAMIC MASKING

BACKGROUND

Traditional image sensors produce large amounts of data for each image captured. In some instances, the large amount of data produced is cumbersome and unnecessary. To use the captured data, some applications reduce large data sets to a manageable size and then process the reduced data sets. This reduction is often performed mathematically by the applications that process the reduced data sets, wasting resources that could otherwise be used to process data.

SUMMARY

Some embodiments provide a novel compressive-sensing image capture device, a method of producing the novel compressive-sensing image capture device, and a method of using data captured by the compressive-sensing image capture device. The novel compressive-sensing image capture device includes an array of sensors for detecting electromagnetic radiation (e.g., visible light, infrared light, ultraviolet light, etc.). In some embodiments, the sensors are photodiodes for detecting visible light. Each sensor in the sensor array has an associated mask that blocks electromagnetic radiation from portions of the sensor. In some embodiments, an array of passive masks is used to block a particular set of areas of each sensor in the sensor array. The passive masks in the array, in some embodiments, are each different and represent a different basis vector, function, or sampling waveform for the collected data.

Passive masks, in some embodiments, are integrated into the sensors of the sensor array directly (e.g., by depositing a blocking material on the individual sensors). In some embodiments, passive mask arrays are printed on a transparent substrate (e.g., glass, plastic, etc.) that is then aligned with the sensor array and physically bonded to the sensor array such that each passive mask corresponds to a particular sensor. A passive mask of some embodiments is a diffractive passive mask that comprises posts of different heights.

In some embodiments, the image capture device also includes an array of lenses corresponding to the sensors of the sensor array such that each sensor receives light that passes through a different lens. In some embodiments, the lenses are condensing lenses that focus the ambient light onto the sensor. The condensing lenses in some embodiments are metalenses that can compensate for small feature size of a pattern mask. Other lens arrays may have refractive, diffractive, or metalens optical features that direct, filter, or change the phase of the incident wave. A metalens, in some embodiments, comprises an array of features deposited on a transparent substrate. The features in some embodiments are nanofins (e.g., features that are on the order of 10-1000 nM) made of titanium dioxide or silicon depending on the type of electromagnetic radiation the metalens is designed to focus. The passive mask, in some embodiments, is integrated with the lens array. In other embodiments, the lens array is provided on a separate substrate or layer.

Some embodiments of the invention provide a dynamic mask array. In some embodiments, the dynamic mask array includes a set of passive masks that can move relative to each other. For example, a first passive mask array as described above is fixed to the sensor array while a second passive mask array attached to a means for moving the second array (e.g., a piezoelectric element, or other means typically used for image stabilization) is placed on top of the first mask array and is cycled through a set of positions (e.g., to coordinates (0,0), (1,0), (1,1), and (0, 1) measured in microns along two principal axes of a plane defined by the sensor array) to effectively create a new passive mask at each position for which image data is captured. In some embodiments, multiple adjustable passive masks are used in addition to the fixed passive mask or without a fixed passive mask to produce the dynamic mask pattern arrays.

The dynamic mask array, in some embodiments, is a liquid crystal display used to dynamically block different areas of sensors in the sensor array. An LCD is combined with a passive mask array, in some embodiments, to produce a set of dynamic masks in a dynamic mask array by using the LCD to block different areas of the passive mask for a particular sensor to effectively create multiple different masks. The multiple different masks can be used to capture data for a single image by cycling through a set of LCD patterns to effectively capture image data for each of the multiple different mask arrays.

Additional compression, in some embodiments, is provided temporally using either the passive or dynamic mask arrays. Temporal compression is achieved, in some embodiments, by capturing data at arbitrary or randomized (e.g., using a random number generator) time points. In some embodiments, the arbitrary or randomized capture times are configured to capture fewer frames per second (i.e., less data per second) on average while not compromising the image quality of a video based on the captured data. the arbitrary or randomized capture times, in some embodiments, are determined for the set of sensors as a whole or for each sensor in a sensor array individually.

The novel compressive-sensing image capture device is used to capture compressive-sensing image data that can be used to perform image analysis or reconstruction. For example, each sensor captures data only using areas of the sensor that are not blocked by the masks (either passive or dynamic). The pattern mask arrays, in this example, effectively perform a filtering function in the physical world that acts as a set of mathematical filtering functions. In some embodiments, data captured by the compressive-sensing image capture device may be understood as a set of coefficients associated with the different basis vector, function, or sampling waveforms that the different mask patterns for each sensor represent. This is in contrast to normal compressive-sensing devices that capture data for each pixel/sensor and then apply compression techniques (e.g., using a set of filter functions to reduce the image data to a set of coefficients) to reduce the amount of data stored for later analysis or reconstruction. By performing the filtering in the physical world, the compressive-sensing image capture device reduces the need for processing captured images and saves power and processing capacity.

In some embodiments, a novel machine trained (MT) network is provided that is trained on image capture data captured by the novel compressive-sensing image capture device to predict solutions to problems. The MT network, in some embodiments, is a multi-layer node network trained on large numbers (e.g., 1,000-100,000) of image capture data from the novel compressive-sensing image capture device with known solutions and is trained to reproduce the known solutions given the image capture data. Once trained, the novel MT network receives a set of input values captured by the novel compressive-sensing image capture device. The set of input values express a problem that the machine trained network needs to solve. For example, in some embodiments, this set of input values includes sensor values associated with an image captured by the novel compressive-sensing image capture device that the method has to process to determine whether the image contains a particular type of content (e.g., a face of a person, an animal, etc.). The set of input values is then processed by the MT network to produce a set of output values that serve as a predicted solution to the problem.

The MT network, in some embodiments, includes several layers of processing nodes, with each processing node having a set of MT parameters. In some embodiments, the MT parameters of the processing nodes are trained by (i) having the MT network process several training input value sets with known output value sets and (ii) adjusting one or more parameters each time that the output value set computed by processing a training input value set is different than the known output value set of the input value set.

In some embodiments, a processing node of the MT network includes (1) a linear component that computes a first output value by combining a set of values that the linear component receives, and (2) a nonlinear component that uses a nonlinear function to compute a second output value from the first output value of the processing node's linear component. A node's linear component in some embodiments receives values from the input value set or from the output of nonlinear components of other processing nodes (e.g., prior processing nodes in the network). In some embodiments, the MT network is a neural network, the processing nodes are neurons, and a neuron's nonlinear component is an activation function, such as a sigmoid function, a tanh function, a ReLU (rectified linear unit) function, or a leaky ReLU function.

By using input data from the novel compressive-sensing image capture device, the MT network reduces the amount of data it must process and can use a simpler MT network structure than is used in processing traditional image data. For example, when the MT network is a neural network, using input data from the novel compressive-sensing image capture device allows the use of a MT neural network without any convolution layers in some embodiments, with only one convolution layer in other embodiments, and with only two convolution layers in still other embodiments.

By eliminating the convolution layers or drastically reducing their number, the method can employ a neural network that uses a fraction of the processing time, size and power of traditional neural networks. This makes the method ideal for implementation on device with more limited processing and memory resources. Examples of such devices include desktops, laptops, mobile devices (e.g., smartphones, tablets, etc.), and IoT (Internet of Things) devices. In some embodiments, such a device has the novel compressive-sensing image capture device incorporated into the device to capture the set of input values for the MT network. Also, in some embodiments, the device executes the MT network to process the input value set to produce the set of output values that express the formulated prediction.

In some embodiments, the device has a set of hardware processing units used to execute software processes that implement the MT processing nodes that process the input value set to produce an output value set that represents a predicted solution to the problem being solved. In some embodiments, the set of hardware processing units are a set of general-purpose, processor units (e.g., in a CPU or GPU of the device).

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Figure 1:
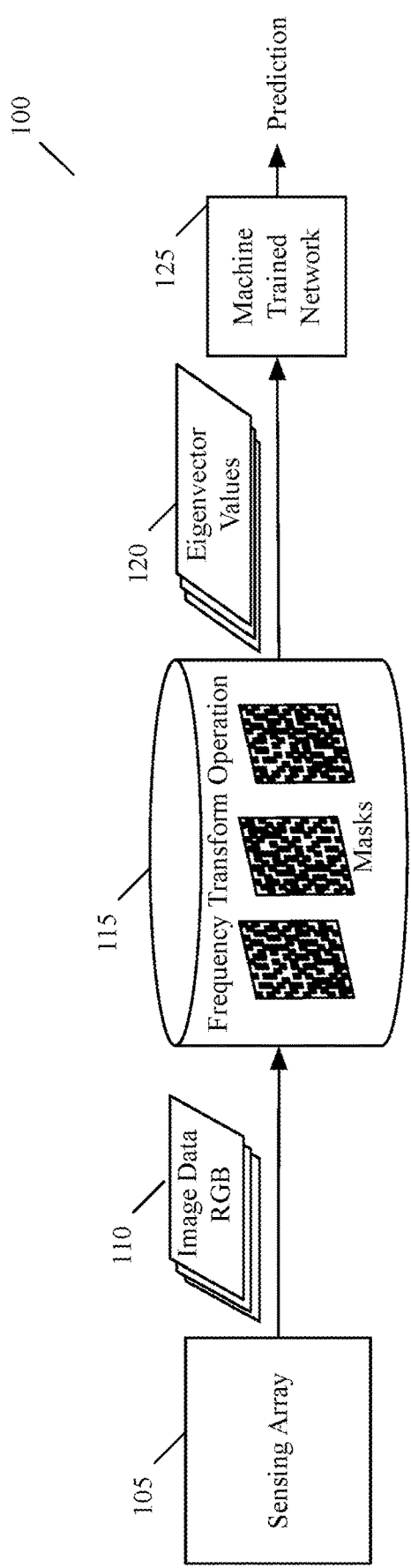
FIG. 1 conceptually illustrates a prior art compressive sensing embodiment.

Some embodiments provide a novel compressive-sensing image capture device, a method of producing the novel compressive-sensing image capture device, and a method of using data captured by the compressive-sensing image capture device. FIG. 1 conceptually illustrates a prior art compressive sensing embodiment 100. Prior art system 100 includes a sensing array 105 (e.g., a CCD sensor) that captures image data 110 (e.g., RGB data), a transform circuit 115 that applies a set of transforms to the captured image data (e.g., a set of masking or sampling functions) to produce a set of eigenvector data 120 (e.g., a set of eigenvectors and associated coefficients) that, in some embodiments, is provided to a machine trained network 125 for processing into a prediction. In other embodiments, the eigenvector data 120 is provided to a storage unit for later retrieval and processing. The prior art embodiment first captures a set of image data 110 using a sensing array 105. In some embodiments, the sensing array includes a large number of sensors (e.g., pixels) and image data 110 is high resolution image data. In order to reduce the size of the image data, the prior art embodiment provides the image data 110 to a transform circuit 115 to perform a compression that includes a set of sampling operations for a set of masking or sampling functions as described below in relation to FIG. 3. The set of sampling functions reduces the image data 110 into a set of coefficients each coefficient corresponding to a particular masking or sampling function (e.g., a basis vector, eigenvector, eigenfunction, etc.). In the illustrated embodiment, the set of eigenvectors are provided to a machine trained network for the machine trained network to produce a prediction or reproduce the image represented by the coefficients.

Figure 2:
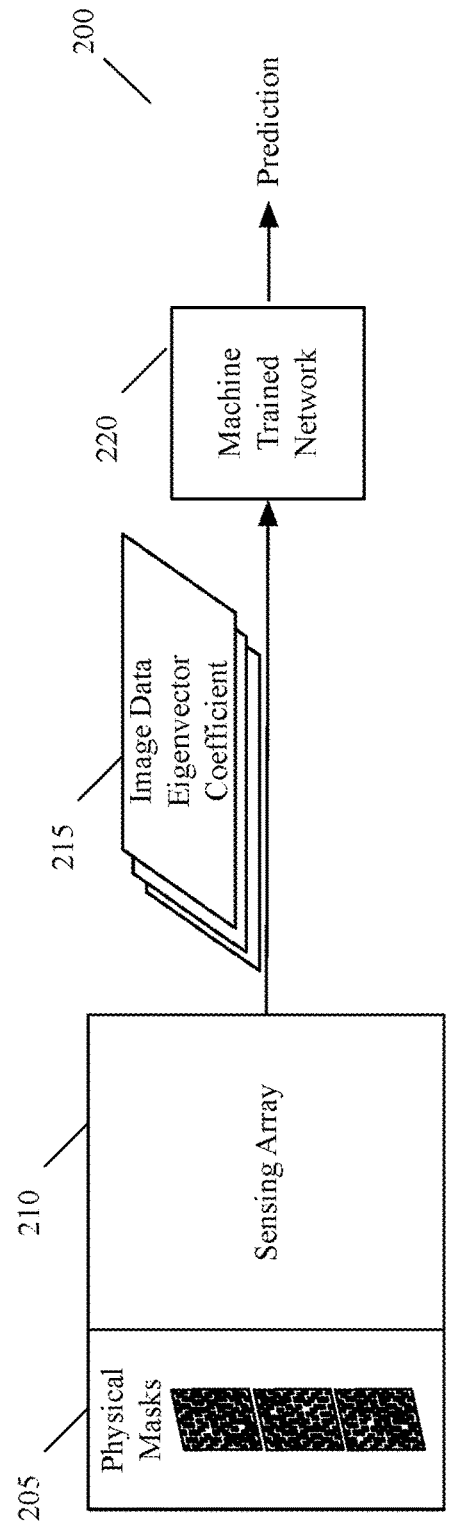
FIG. 2 conceptually illustrates an embodiment of the novel compressive sensing architecture.

FIG. 2 conceptually illustrates an embodiment 200 of the novel compressive sensing architecture. Novel system 200 includes a compressive sensing array 205 (e.g., a CCD sensor) that includes a set of physical masks associated with the sensors that capture compressed image data 210, and a machine trained network 225 for processing the compressed image data into a prediction or reconstructed image. As opposed to the prior art embodiment in which the full image was captured by the sensor array, in the novel embodiment 200, the sensor array captures data that represents a set of coefficients associated with different physical masks. The captured data, in some embodiments, is stored in a data storage (not shown) either locally (e.g., in a memory unit of the device) or remotely (e.g., in an external hard drive or in the cloud). In some embodiments, each physical mask is equivalent to a masking or sampling function used by a transform circuit (e.g., transform circuit 115). Additional details are discussed below in relation to FIG. 4.

Figure 3:
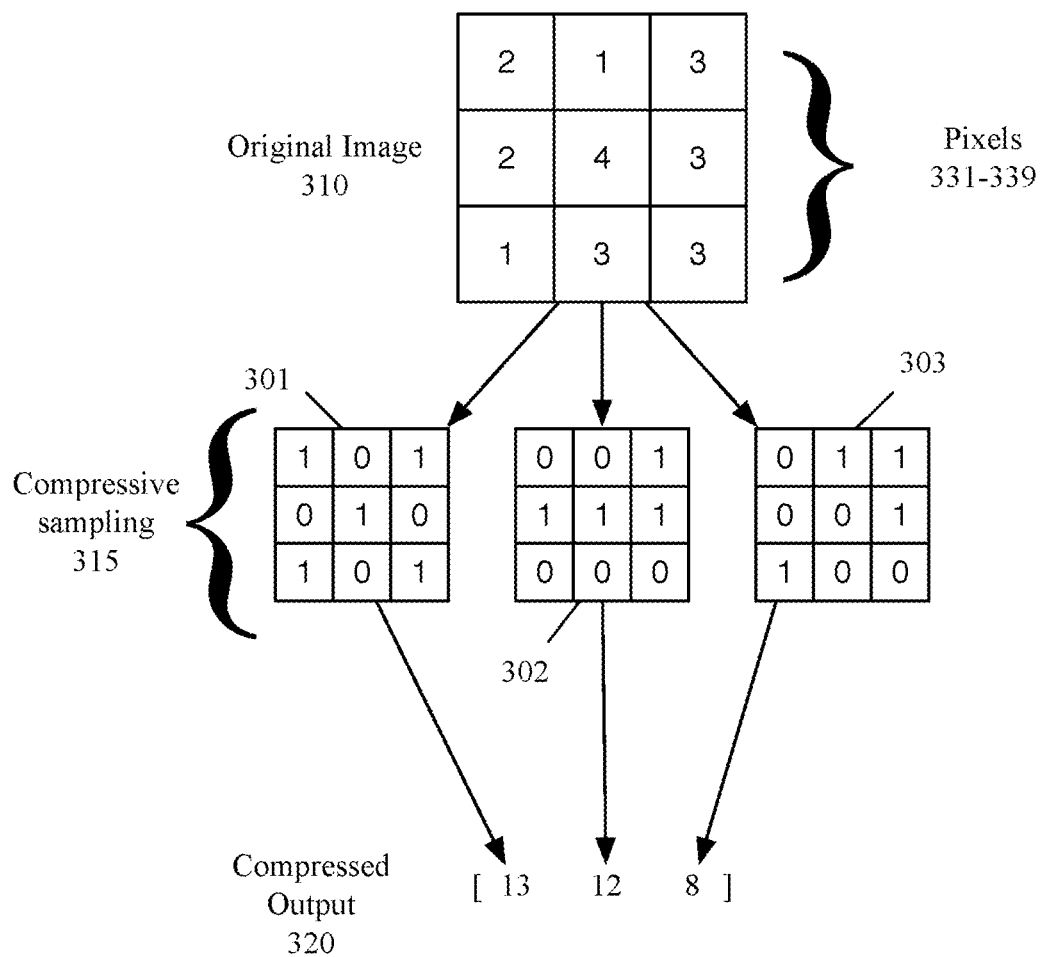
FIG. 3 conceptually illustrates a prior art computational compressive sensing transform operation.

FIG. 3 conceptually illustrates a prior art computational compressive sensing transform operation. FIG. 3 illustrates prior art captured image data 310, compression operation 315, and compressed output 320. Original image data 310 includes a set of 9 values for a set of pixels 331-339. One of ordinary skill in the art will understand that the such a set of pixel values is produced for each of red, green, and blue values. In order to compress the original image data 310, the prior art uses compressive sampling (e.g., masking) operation 315 that uses a set of masks (e.g., basis vectors or eigenvectors) 301-303 to sample the captured image data 310. In the embodiment depicted in FIG. 3, the set of masks 301-303 is a set of masks that include a value (i.e., 1 or 0) associated with each pixel indicating that the pixel is either used to calculate the associated coefficient or is ignored. For example, applying mask 301 to image data 310 only includes the values 2, 3, 4, 1, and 3 for pixels 331, 333, 335, 337, 339 respectively to compute a coefficient of 13 associated with the mask 301. In actual embodiments, the image capture data 310 would include approximately 1-4 million pixel values and a single image might require multiple Megabytes of memory to store uncompressed. In some such embodiments there are approximately 25 thousand masks allowing the image data to be stored using only 25 thousand coefficients instead of 1-4 million pixel values. Based on the compressive sensing operation 315, compressed output 320 including a value (e.g., coefficient) associated with each of the masks 301-303.

Figure 4:
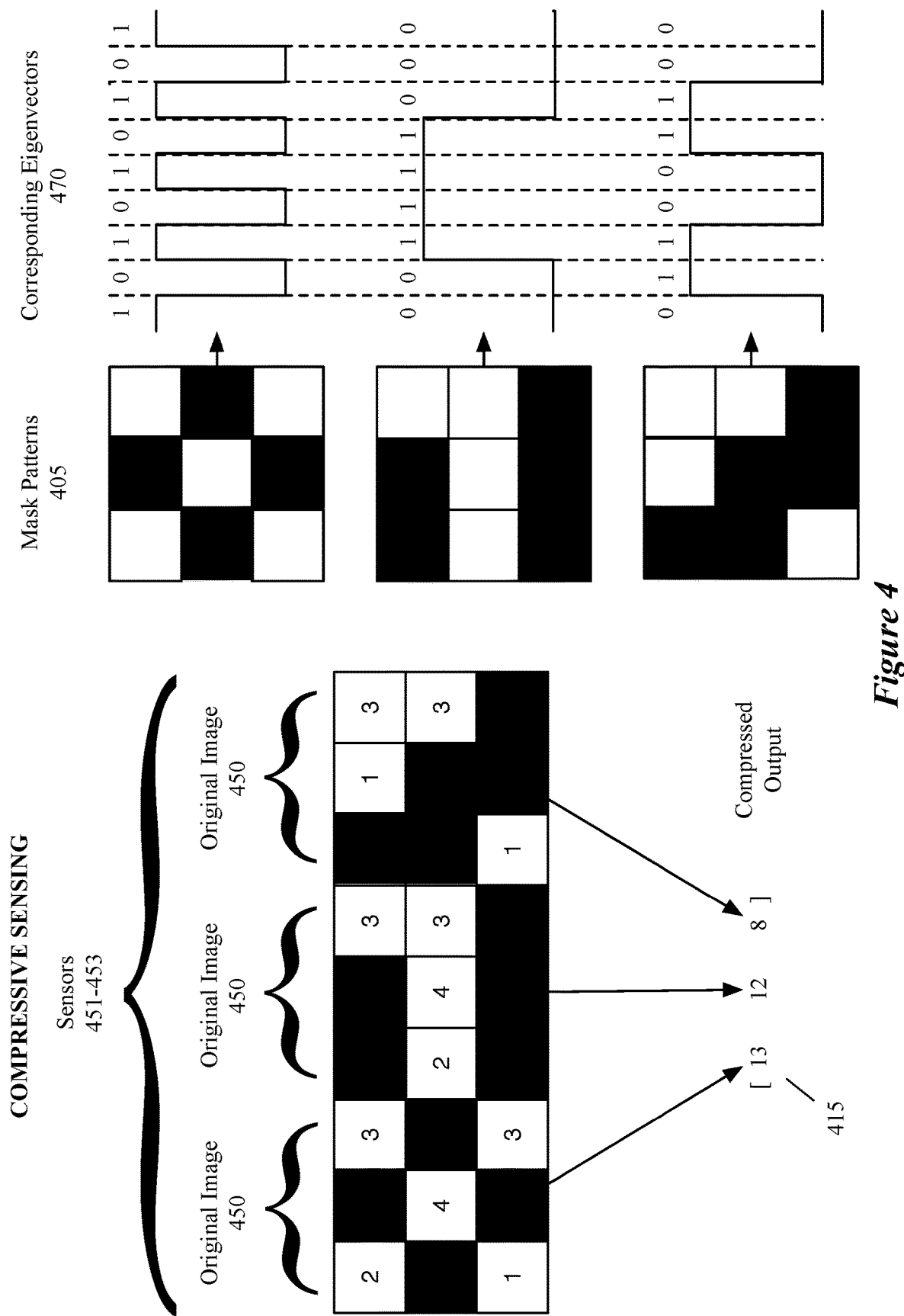
FIG. 4 conceptually illustrates a physical compressive sensing transform operation.

FIG. 4 conceptually illustrates a physical compressive sensing operation. FIG. 4 illustrates a set of sensors (e.g., pixels) 451-453 of a sensor array that are each associated with a particular mask pattern in the set of masks patterns 405. The mask patterns physically block incoming signal (e.g., electromagnetic radiation) from certain areas of sensors 451-453 to implement the sampling performed computationally in the prior art embodiment. As shown, mask patterns 405 are divided into square regions or portions that are either occluding (indicated by black areas of the mask patterns 405) or transparent (indicated by white areas of the mask patterns 405). In some embodiments, the mask patterns are regions of a larger mask pattern, each region associated with a particular sensor and including occluding and transparent sub-regions that respectively block (either partially or completely) light from or allow light to reach the sensor. In some embodiments, different members of the mask pattern make up the occluding and transparent regions or sub-regions. While mask patterns 405 are shown as being square-based (i.e., occluding and transparent regions being square shaped and laid out on a grid), in other embodiments, the members or regions are any of rectangle-based, triangle-based, hexagon-based, irregular polygon-based (using space-filling polygons) and in some embodiments the individual members or portions of the mask pattern are of different size.

Instead of capturing the entire image and then performing a mathematical/computational masking/sampling operation, the entire image, in some embodiments, is projected (e.g., focused by a lens) onto each sensor with physical masks 405 blocking areas associated with ignored pixels of the prior art embodiment. Similarly to the prior art example for mask 301, sensor 451 only includes (i.e., captures data for) the image data corresponding to the values 2, 3, 4, 1, and 3. By only capturing data for the unmasked portions of the sensor, the sensor measures (and outputs) the coefficient associated with the first mask. Compressed output 455 illustrates that the same input image and masking patterns produce the same set of output coefficients from the novel compressive sensing embodiment without ever storing the larger image data or performing any additional filtering or computations. In using physical compressive sensing, a same image quality can be achieved with fewer sensors (e.g., 1-25 thousand sensors instead of 1-4 million). This allows devices to use bigger, easier to fabricate (and therefore less expensive) sensors with a same form factor as a standard image capture device without sacrificing quality.

Figure 5:
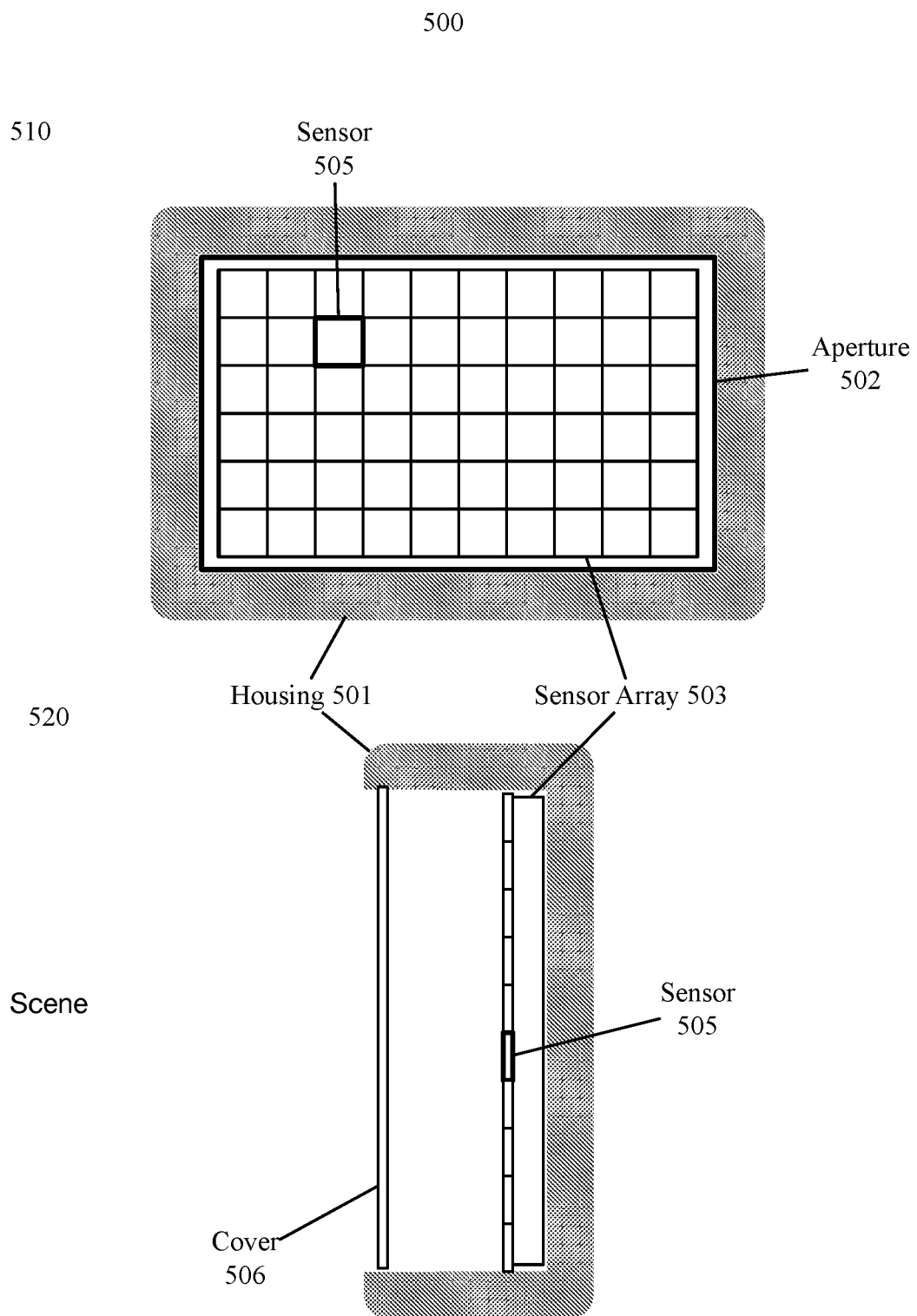
FIG. 5 illustrates a set of components of a sensor array device of some embodiments.

FIG. 5 illustrates a set of components of a sensor array device of some embodiments. FIG. 5 depicts a front view 510 and side view 520 of an image capture device 500 that includes a frame 501 that defines an aperture 502 (in some cases filled with a glass, lens, lens array, or diffraction structure 506) and a sensor array 503 of individual sensors 505 (e.g., photodiodes). Each sensor 505 in the array of sensors 503, in some embodiments, is for detecting electromagnetic radiation (e.g., visible light, infrared light, ultraviolet light, etc.). In some embodiments, the sensors are photodiodes for detecting visible light. Each sensor in the sensor array, in some embodiments, has an associated mask that occludes (e.g., blocks or partially blocks) electromagnetic radiation from portions of the sensor. In order to reduce the output from the sensor array, some embodiments use sensor arrays that are less than 500 sensors by 500 sensors (e.g., 136×76 photodiode array). In some embodiments, the reduced number of sensors can be used to produce an image with greater spatial resolution (e.g., an array of 136×76 pixels used to generate an image that is 1,280×720 pixels). Some embodiments produce less than 1 MB of data for each captured image.

Figure 6:
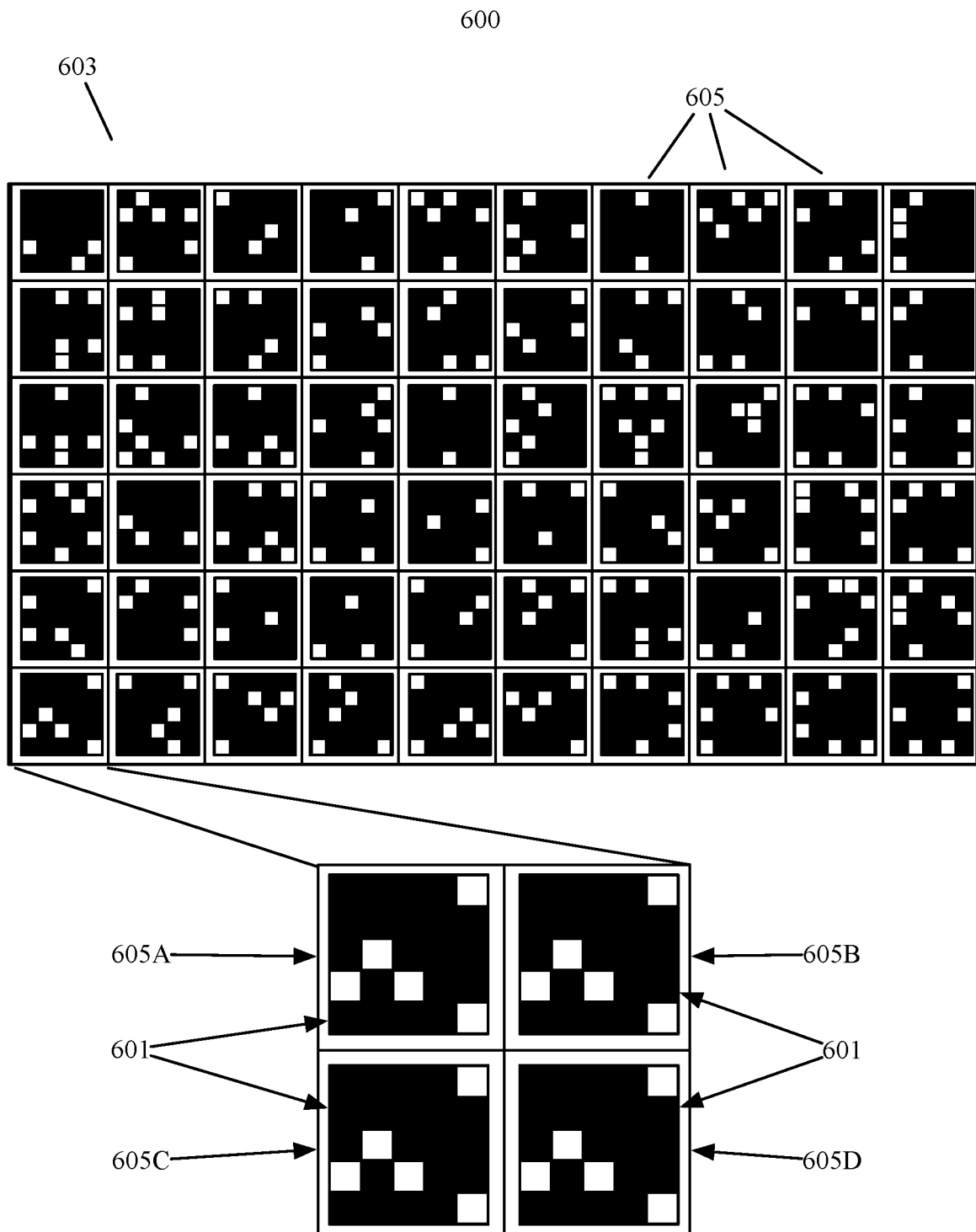
FIG. 6 illustrates an exemplary portion of a passive-filter array for blocking electromagnetic radiation from sensors in a sensor array with a similar passive mask for each of a group of GRGB sensor areas.

FIG. 6 illustrates an exemplary portion 600 of a set of passive-filters 601 arranged in an array and imposed on a sensor array 603 for blocking electromagnetic radiation from sensors 605 in sensor array 603. Each sensor 605 in the sensor array, in some embodiments, is masked by a passive-filter 601 in an array of passive-filter masks used to occlude (e.g., block or partially block) a particular set of areas of each sensor in the sensor array. In some embodiments, a particular sensor is subdivided into a set of color masks 605A-D (e.g., the familiar GRGB pattern) and each color mask has a common passive-filter pattern 601. The passive-filter masks 601 in the array, in some embodiments, are each different and represent a different basis vector or sampling waveform for the collected data. In some embodiments, a set of different passive-filter masks (e.g., 1000 different passive-filter mask patterns) is used to mask a larger set of sensors in a sensor array (e.g., 2000-4000 sensors) such that each different passive-filter mask pattern is used for multiple different sensors.

Figure 7:
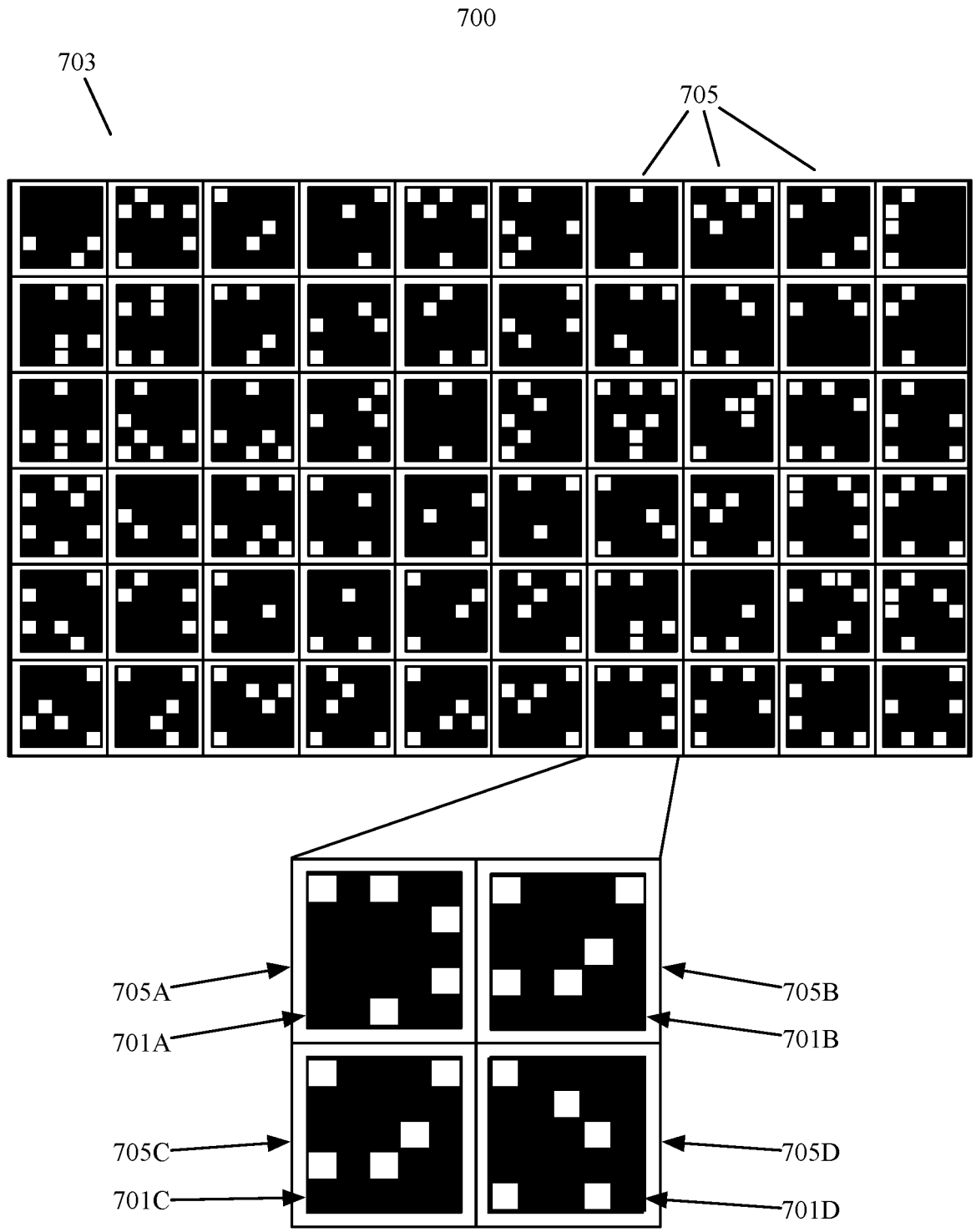
FIG. 7 illustrates an exemplary portion of a passive-filter array for blocking electromagnetic radiation from sensors in a sensor array with a distinct passive mask for each of a group of GRGB sensor areas.

FIG. 7 illustrates an exemplary portion 700 of a set of passive-filters 701 arranged in an array and imposed on a sensor array 703 for blocking electromagnetic radiation from sensors 705 in sensor array 703. Each sensor 705 in the sensor array, in some embodiments, is masked by a passive-filter 701 in an array of passive-filter masks used to block a particular set of areas of each sensor in the sensor array. In some embodiments, a particular sensor is subdivided into a set of color masks 705A-D (e.g., the familiar GRGB pattern) and each color mask has a different passive-filter mask 701A-D. The passive-filter masks 701 in the array, in some embodiments, are each different and represent a different basis vector or sampling waveform for the collected data. In some embodiments, a set of different passive-filter masks (e.g., 1000 different passive-filter mask patterns) is used to mask a larger set of sensors in a sensor array (e.g., 2000-4000 sensors) such that each different passive-filter mask pattern is used for multiple different sensors. For both FIGS. 6 and 7 passive-filter masks with square-based patterns are depicted, however, in other embodiments, other space-filling shapes (e.g., triangles, hexagons, rectangles, irregular polygons, etc.) are used to generate the patterns of occluding and transparent regions of the passive-filter mask (i.e., an image-compressing mask). In some embodiments, the masking patterns 601 and 701 have periodicity such that the associated basis vectors, functions, or waveforms form a basis for a frequency domain transform.

As will be discussed below in relation to FIG. 8, passive-filter masks, in some embodiments, are integrated into the sensors 605 of the sensor array 603 directly (e.g., by depositing a blocking material on the individual sensors or other common mask fabrication techniques). In some embodiments, passive-filter mask arrays are printed on a transparent substrate (e.g., glass, plastic, etc.) that is then aligned with the sensor array and brought into physical proximity or physically bonded to the sensor array such that each passive mask corresponds to a particular sensor. A passive-filter mask that is printed on a substrate, in some embodiments, is printed on a particular surface of the substrate that is nearest the sensor surface to reduce the leakage of light into areas that are masked. In some embodiments, a passive mask array includes masked boundaries (not shown) of each passive mask that block electromagnetic radiation to allow for imperfect alignment of the substrate and the sensor array. Passive-filter masks of some embodiments block more than 90% of incident light.

Figure 8:
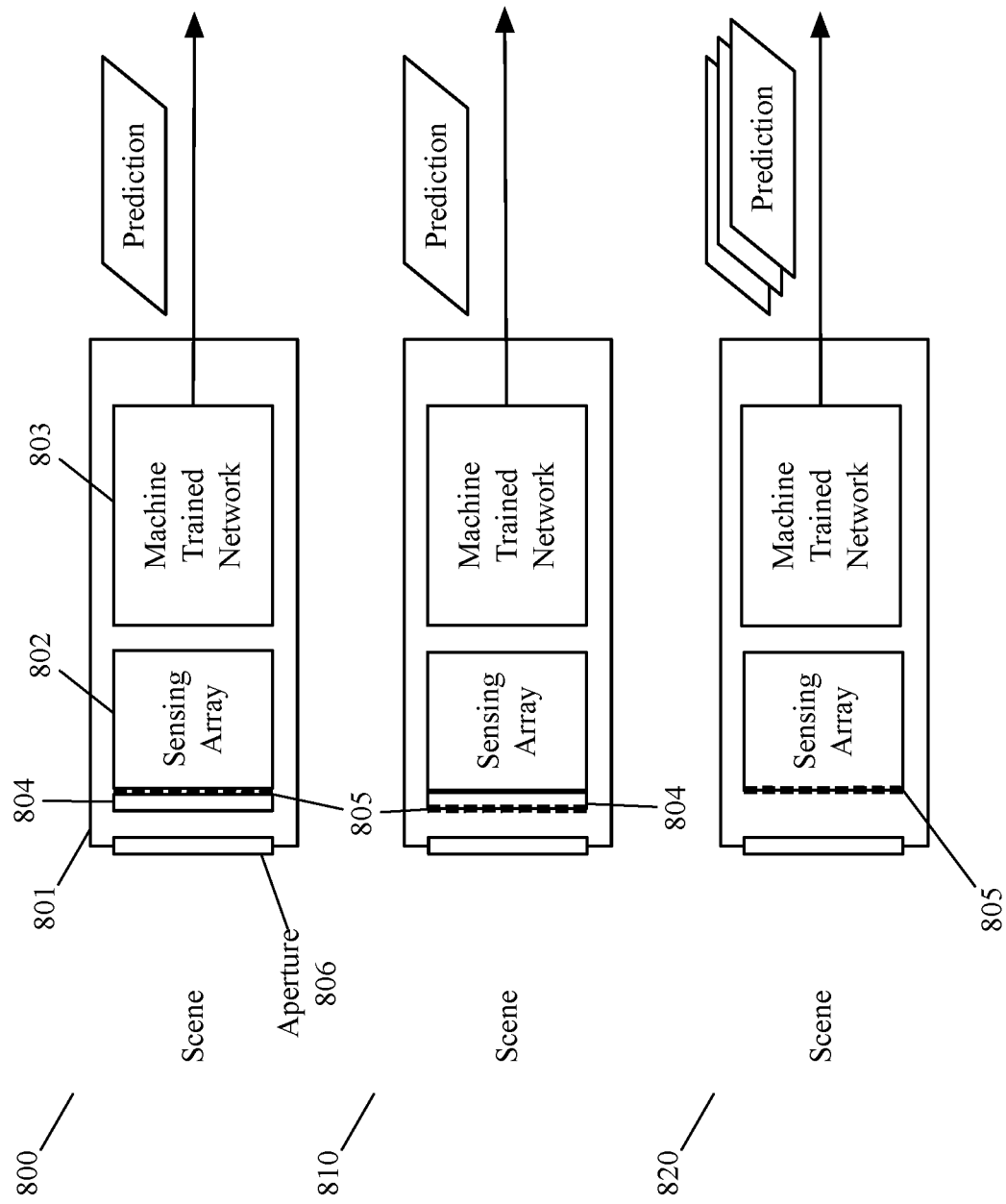
FIG. 8 illustrates multiple configurations for a novel compressive sensing device incorporating a passive-filter array.

FIG. 8 illustrates multiple configurations 800, 810, and 820 for a novel compressive sensing device incorporating a passive-filter array 805. Configuration 800 of FIG. 8 conceptually illustrates a first construction and method of construction of a compressive sensing device. Configuration 800 includes device 801 which includes sensing array 802, machine trained network 803, a passive-filter mask substrate 804 and passive-filter mask 805 printed on substrate 804. For clarity, aspects of the device such as the aperture are omitted and space is introduced between the passive-filter mask pattern and sensing array 802. In some embodiments, the substrate is bonded to the sensing array so as to minimize the distance between the passive-filter mask array and the individual sensors of the sensing array. In some embodiments, minimizing the distance reduces the amount of light that leaks around the edges of the blocked areas. Configuration 810 illustrates a similar construction technique, but prints the passive-filter mask array 805 on the substrate 804 on the externally facing side of the substrate. In some embodiments, leaving the bonded side of the substrate clear of printing allows for better bonding with sensing array 802.

Configuration 820 illustrates a different method of providing the passive-filter mask array. Configuration 820 incorporates the passive-filter mask array directly on the sensors of sensing array 802. In some embodiments, the passive-filter masks are deposited directly on the sensors of the sensing array 802 using photolithographic techniques. In other embodiments, other methods of depositing opaque material to form the passive-filter mask array 805 are used. As discussed above and in relation to FIG. 5, sensing array 802 and passive-filter mask array 805 are contained within a housing and protected from the elements by a transparent material covering the aperture through which the signal (e.g., light or other electromagnetic radiation) passes.

Figure 9:
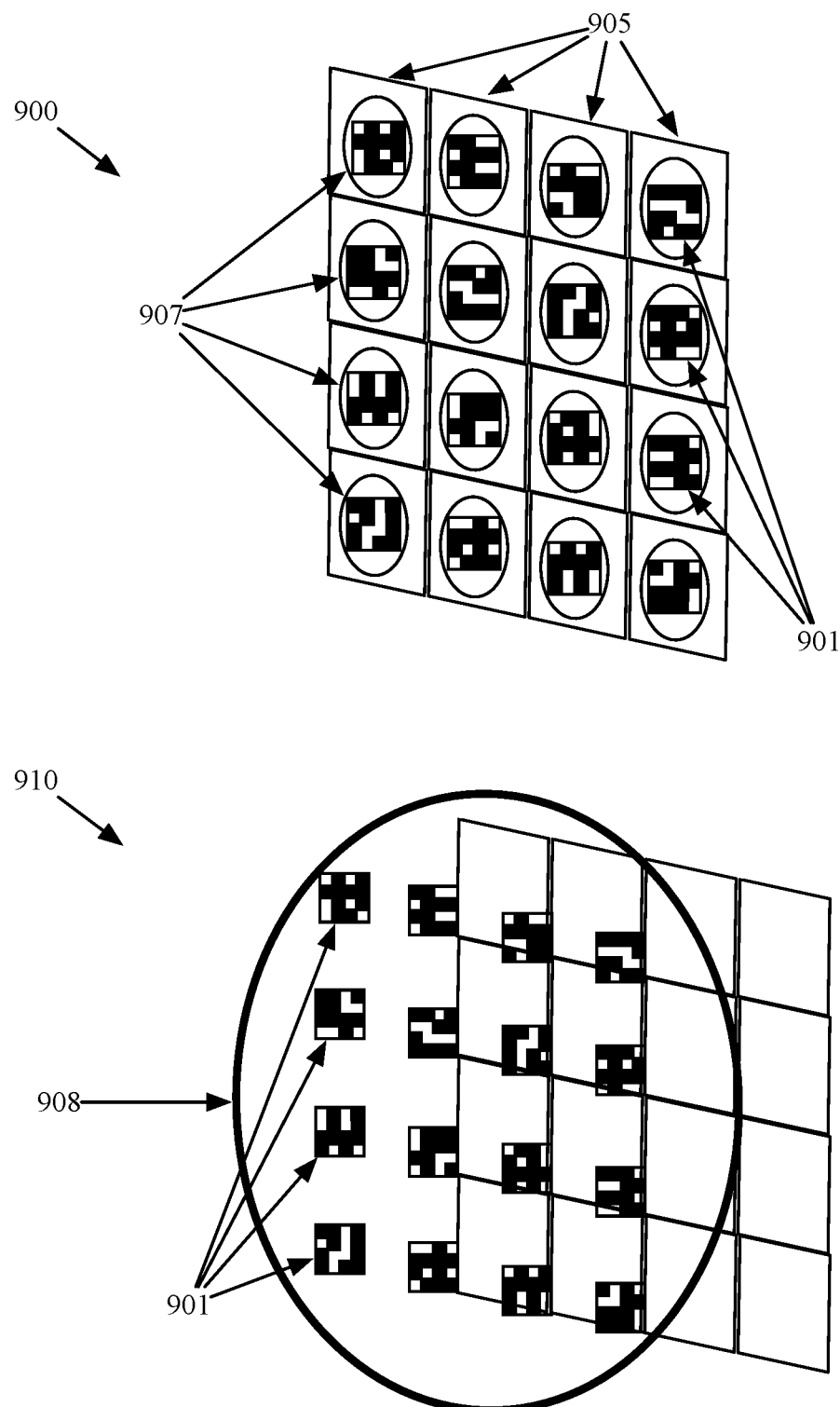
FIG. 9 illustrates a sensor array combined with different lens and passive-filter mask configurations of some embodiments.

In some embodiments, the image capture device also includes a set of lenses. FIG. 9 illustrates a sensor array combined with different lens and passive-filter mask configurations of some embodiments. FIG. 9 illustrates an array of sensors 905 and a corresponding array of passive-filter masks 901, the sensor and mask array in a first embodiment 900 is combined with an array of lenses 907 each corresponding to a sensor 905 and mask 901 in the sensor array and in a second embodiment 910 is combined with a single lens 908 placed in front of the sensor array on which a passive-filter mask array is printed. In some embodiments, the lenses are condensing lenses that focus the ambient light onto the sensor. The condensing lenses in some embodiments are metalenses that can compensate for small feature size of a pattern mask. Other lens arrays may have refractive, diffractive, or metalens optical features that direct, filter, or change the phase of the incident wave. In some embodiments, the optical features are useful for overcoming diffraction limits for passive-filter masks using features on the order of the wavelength of the incident electromagnetic radiation. The features in some embodiments are nanofins (e.g., features that are on the order of 10-1000 nM) made of titanium dioxide or silicon depending on the type of electromagnetic radiation the metalens is designed to focus. The passive-filter masks, in some embodiments, are printed on the sensors or on a substrate as discussed above in relation to FIG. 8. In some embodiments including a lens or set of lenses, the passive-filter masks are printed directly on one of a front or back surface of the lens or set of lenses. In other embodiments, the lens array is provided on a separate substrate or layer.

Figure 10:
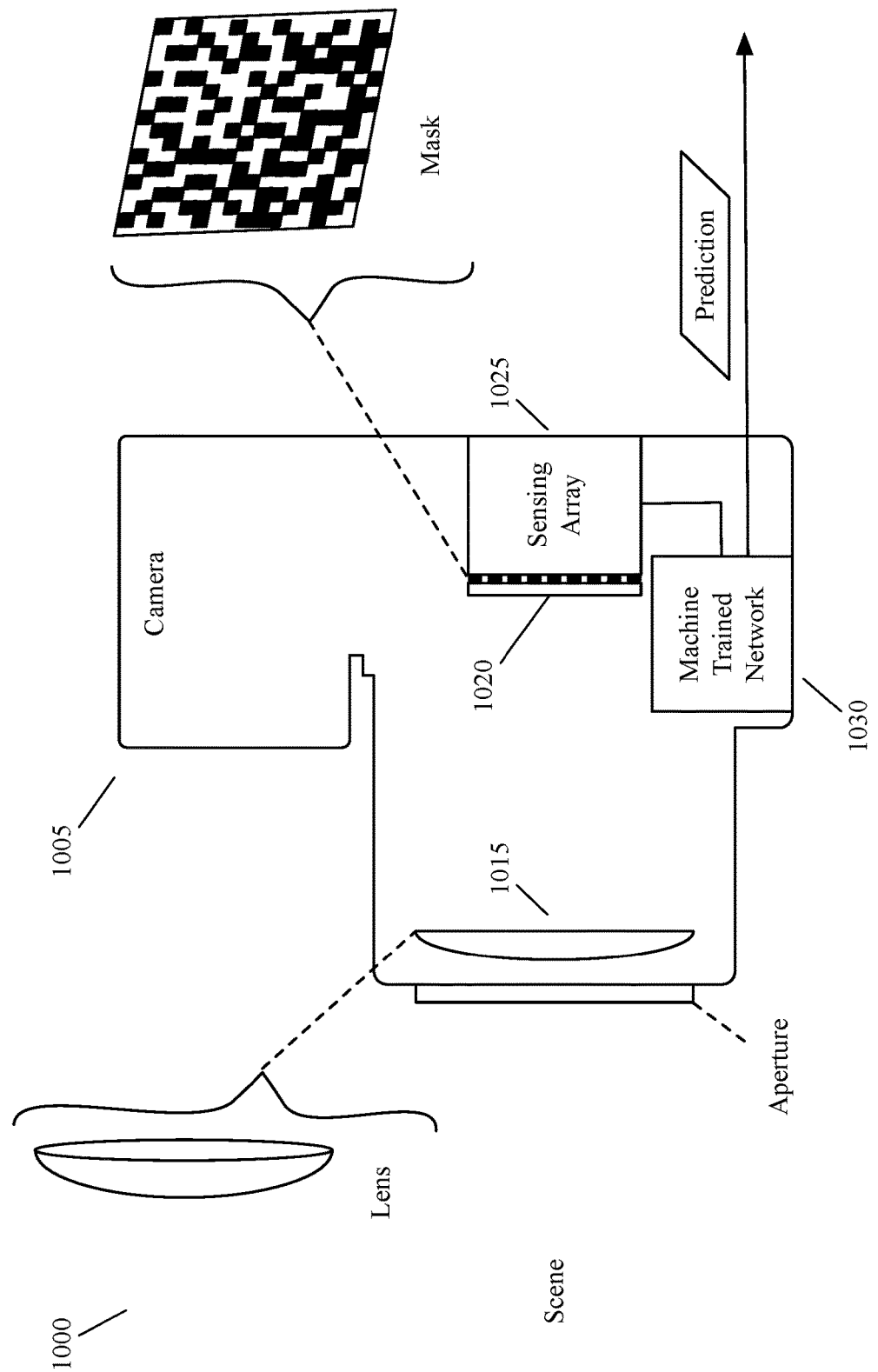
FIG. 10 illustrates an embodiment of a compressive sensing device incorporated into a camera.

FIG. 10 illustrates an embodiment of a compressive sensing device 1005 incorporating a single lens 1015 and a passive-filter mask array 1020. Compressive sensing device 1005 is a camera that includes an aperture for letting in light, lens 1015 for focusing the light, passive-filter mask 820 (as shown it is a printed mask on a substrate), sensing array 1025, machine trained network 830 that is used to produce prediction 1040. As shown passive filter mask is placed in the path from lens 1015 to sensing array 1025 and is bonded to the sensing array as in configuration 800 of FIG. 8. Machine trained network 1030 receives compressively sensed image data and, in the depicted embodiment, generates a prediction based on the compressively sensed image data.

Figure 11:
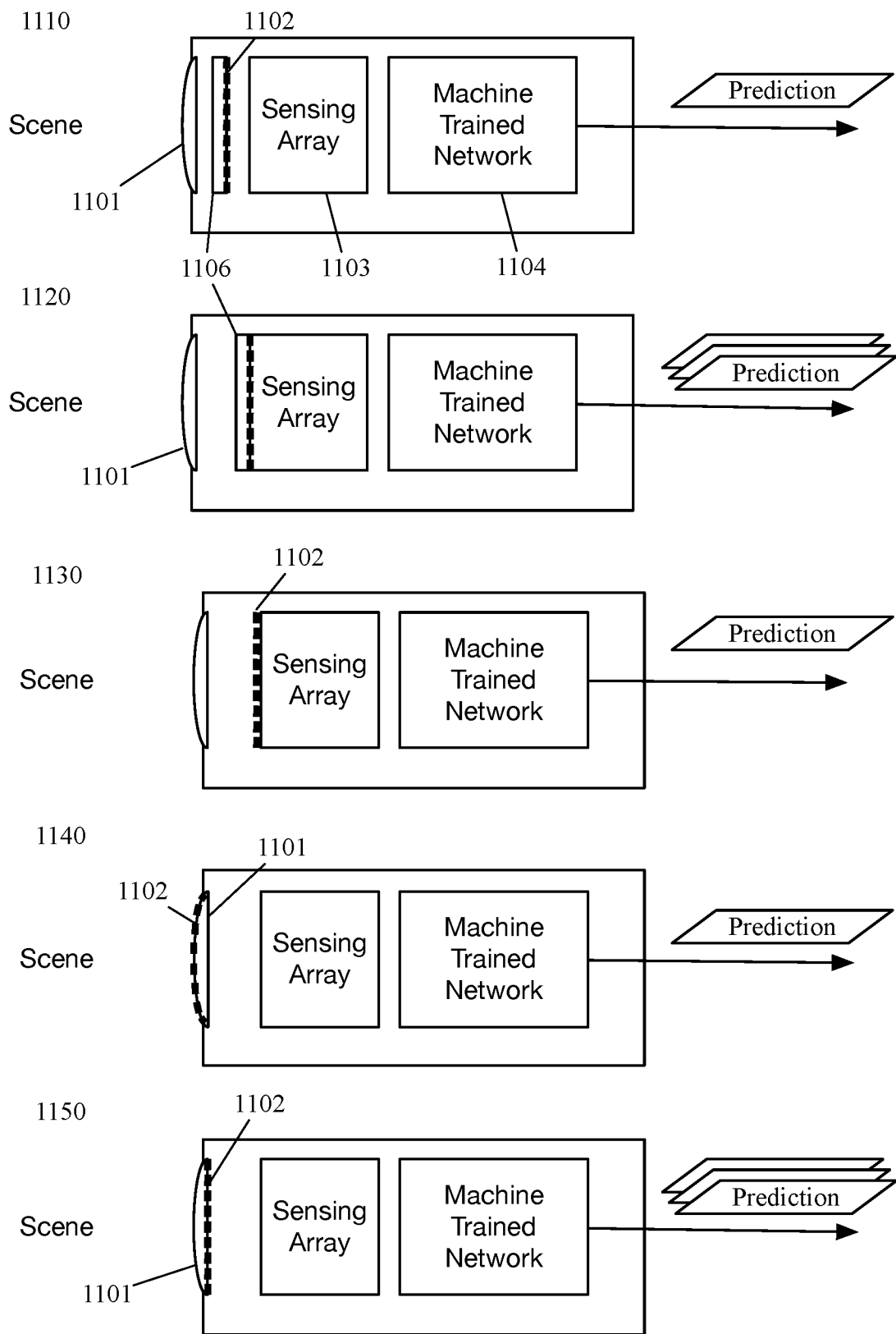
FIG. 11 illustrates multiple configurations for a novel compressive sensing device incorporating a passive-filter array and a single focusing lens.

FIG. 11 illustrates multiple configurations 1110-1150 for a novel compressive sensing device incorporating a passive-filter array and a single focusing lens that produces a set of predictions. Configurations 1110 and 1120 include lens 1101, passive-filter mask substrate 1106, passive-filter mask 1102, sensing array 1103, and machine trained network 1104. Configuration 1110 includes the passive-filter mask element (substrate 1106 and filter 1102) at an arbitrary position between lens 1101 and sensing array 1103, while configuration 1120 includes the passive-filter mask element is bonded to the sensing array 1103.

Configurations 1130-1150 include lens 1101, passive-filter mask 1102, sensing area 1103, and machine trained network 1104. The passive-filter mask 1102 in configuration 1130 is printed or deposited directly onto the sensors of the sensing array (e.g., by photolithographic techniques or other deposition techniques) as discussed above in relation to FIG. 8. Configurations 1140 and 1150 print the passive-filter mask 1102 directly on lens 1101. Configuration 1140 illustrates a configuration with passive-filter mask 1102 printed on the 'front' of lens 1101. In order to achieve the desired masking, some embodiments design the passive-filter mask pattern desired at the surface of the sensing array 1103 and then perform a topologic transformation to account for the curvature of lens 1101 before printing the transformed pattern on lens 1101. Configuration 1150 illustrates a configuration in which passive-filter mask 1102 is printed on the 'back' side of lens 1101. In the depicted embodiment, the back of lens 1101 is flat and passive-filter mask 1102 is printed as designed to appear at sensing array 1103. One of ordinary skill in the art understands that in some embodiments both sides of lens 1101 are curved and the transformation of the passive-filter mask pattern 1102 is performed whether printed on the front or back side of lens 1101.

Figure 12:
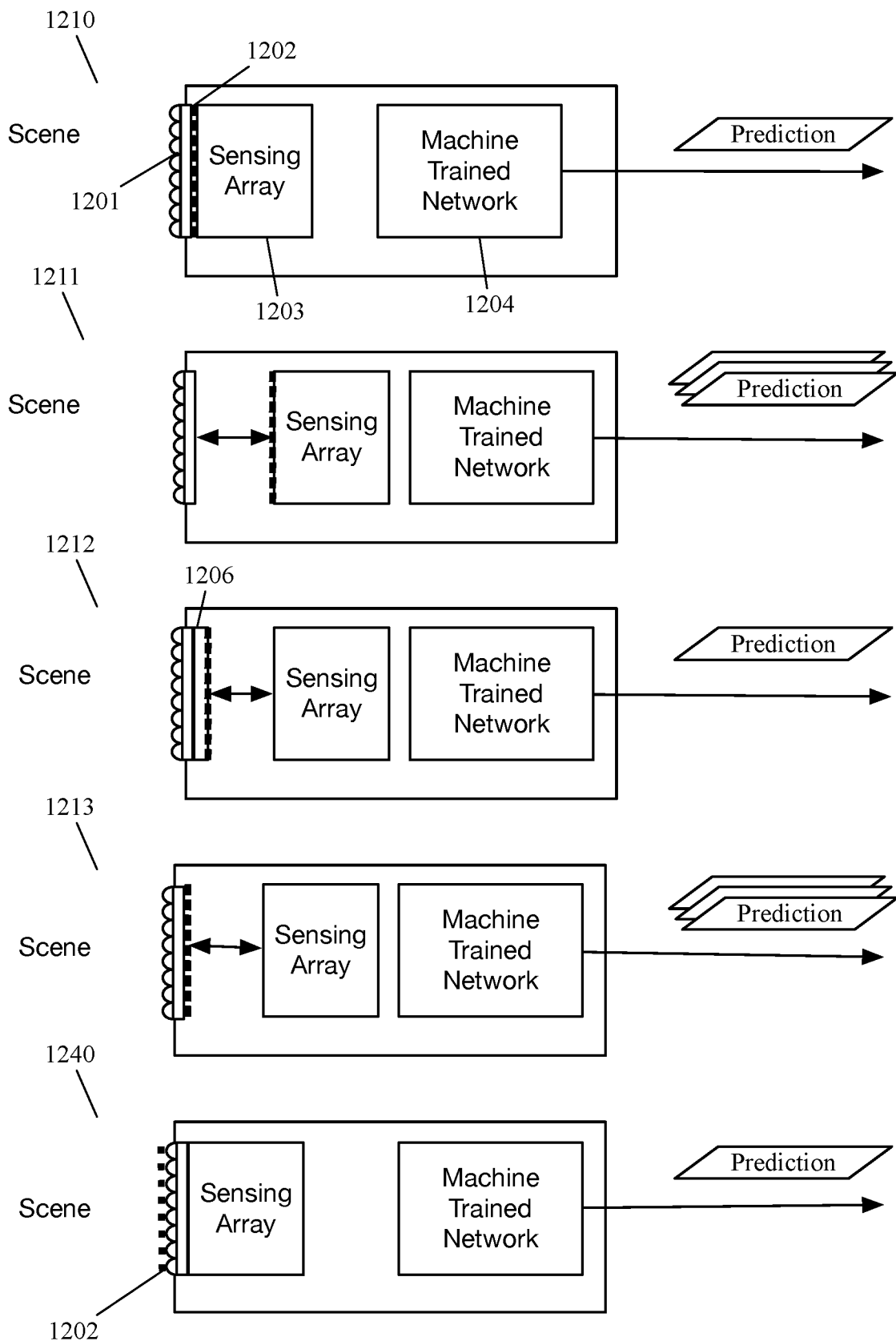
FIG. 12 illustrates multiple configurations for a novel compressive sensing device incorporating a passive-filter array and a single focusing lens.

FIG. 12 illustrates multiple configurations 1210-1240 for a novel compressive sensing device incorporating a passive-filter array and a focusing lens array that produces a set of predictions. Configurations 1210-1213 incorporate focusing lens array 1201, passive-filter mask array 1202, sensing array 1203 and machine trained network 1204. Configuration 1210 illustrates the complete device as deployed in some embodiments with configurations 1211-1213 illustrating exploded views of different ways in which the configuration 1210 are constructed in some embodiments with the two sided arrows indicating elements that are bonded or otherwise placed in close proximity, but are shown separately for clarity. Configuration 1210 illustrates that, in some embodiments, focusing lens array 1201 is bonded to sensing array with passive-filter mask array 1202 interposed between focusing lens array 1201 and sensing array 1203. Configuration 1211 illustrates a construction in which passive-filter mask 1202 is directly deposited or printed on the sensors of sensing array 1203 (photolithographically or otherwise) and then bonded to focusing lens array 1201. Configuration 1212 illustrates a construction including substrate 1206 on which passive-filter mask array 1202 is printed before being sandwiched between focusing lens array 1201 and sensing array 1203. Configuration 1213 illustrates a construction in which passive-filter mask array 1202 is printed directly on the back of focusing lens array 1201.

Configuration 1240 illustrates a construction similar to that of configuration 1210 except that instead of placing passive-filter mask array 1202 between focusing lens array 1201 and sensing array 1203, passive-filter mask array 1202 is printed on the front surface of focusing lens array 1201. As described above in relation to FIG. 11, printing on the front surface of focusing lens array, in some embodiments, requires a transformation of a passive-filter mask array designed from a planar design to one that takes the curvature of the lens surface into account. Focusing lens array 1201, in some embodiments, is a monolithically fabricated lens array including a block of material that spaces the focusing lens by one focal length (e.g., 217 microns), in other embodiments, a spacing sheet has lenses (e.g., lenses created by molding, jet printing, replicating, or deposited beads with the proper curvature) bonded to one side with the other side bonded to the sensor array (with the different embodiments of the passive-filter mask array). In some embodiments, focusing lens array 1201 is an array of lenses with a spacing of approximately 250 microns (e.g., approximately corresponding to the size of a sensor in the sensing array)

Figure 13:
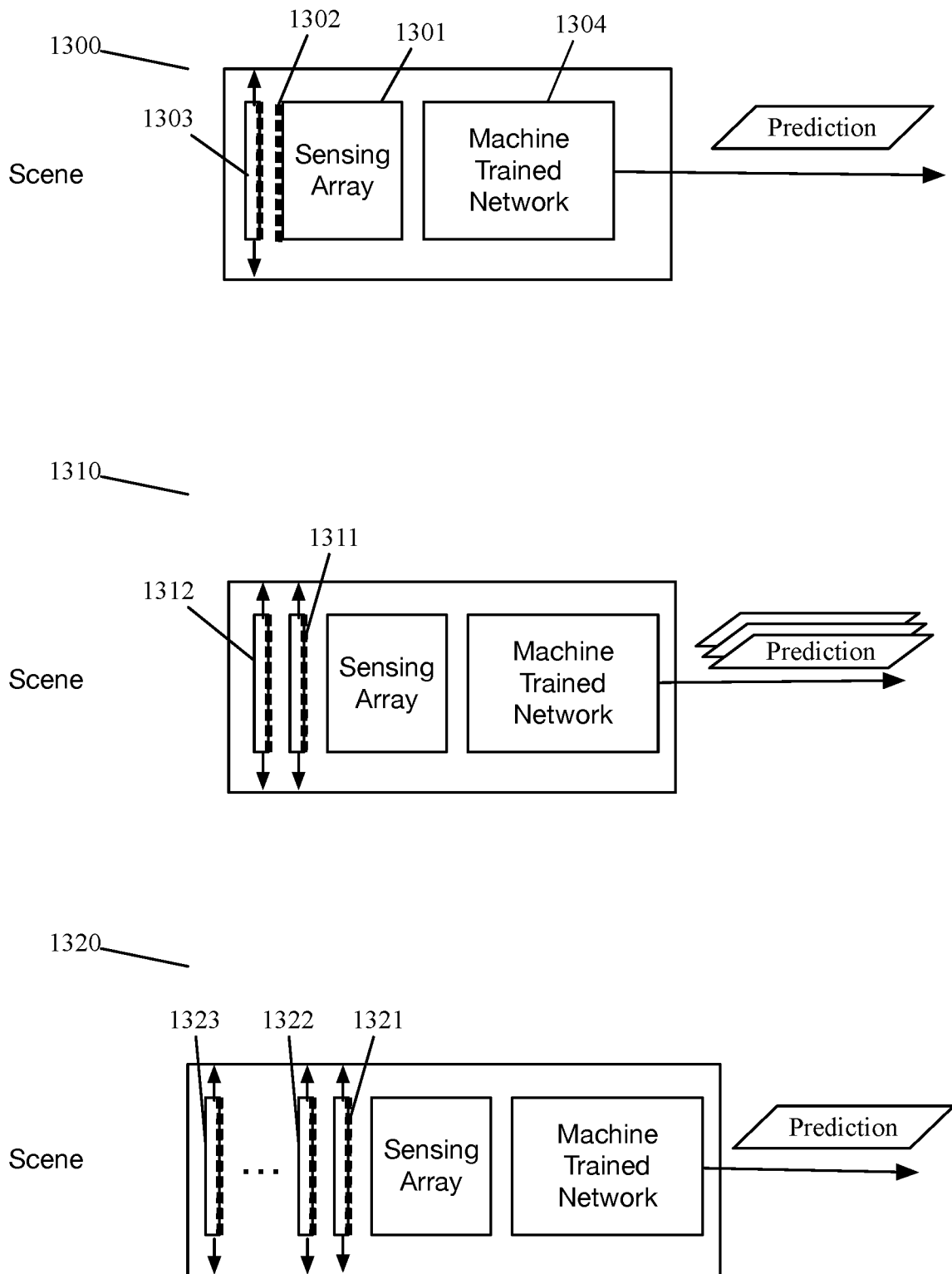
FIG. 13 illustrates multiple configurations for a dynamic mask array comprising multiple passive-filter masks.

Some embodiments of the invention provide a dynamic mask array. FIG. 13 illustrates multiple configurations for a dynamic mask array comprising multiple passive-filter masks. Configuration 1300 depicts a first construction including passive-filter mask 1303 printed on a substrate that can move in directions parallel to the surface of sensing array 1301. Configuration 1300 also includes 1302 that is printed or deposited on sensing array 1301 and a machine trained network 1304 that generates a set of predictions.

Configuration 1310 and 1320 illustrate constructions that utilize multiple passive-filter mask arrays (1311 and 1312, and 1321-1323) that move relative to each other and the sensing array to create multiple different mask patterns. Configurations 1310 and 1320 depict multiple passive-filter masks (1311, 1312, and 1321-1323) that are printed on substrates and mounted in such a way to be movable relative to each other and the sensing array. In some embodiments, the movement is accomplished by a set of piezoelectric elements or other similar controllable elements that can quickly and accurately reposition the passive-filter mask array.

Figure 14:
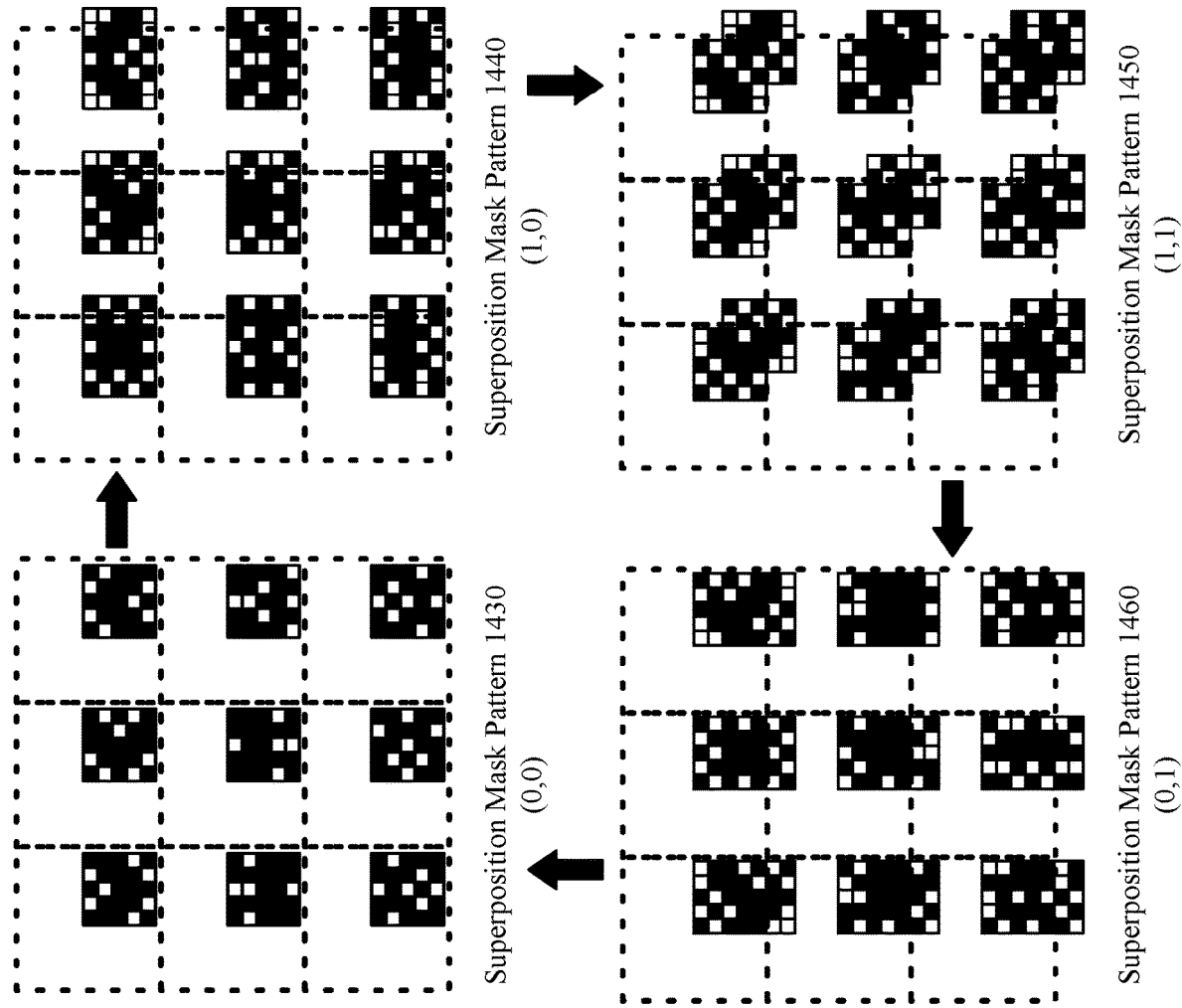
FIG. 14 illustrates an example of a plurality of passive-filter masks used to create a dynamic mask array that creates multiple superposition mask patterns through relative motion of the masks.
Figure 14:
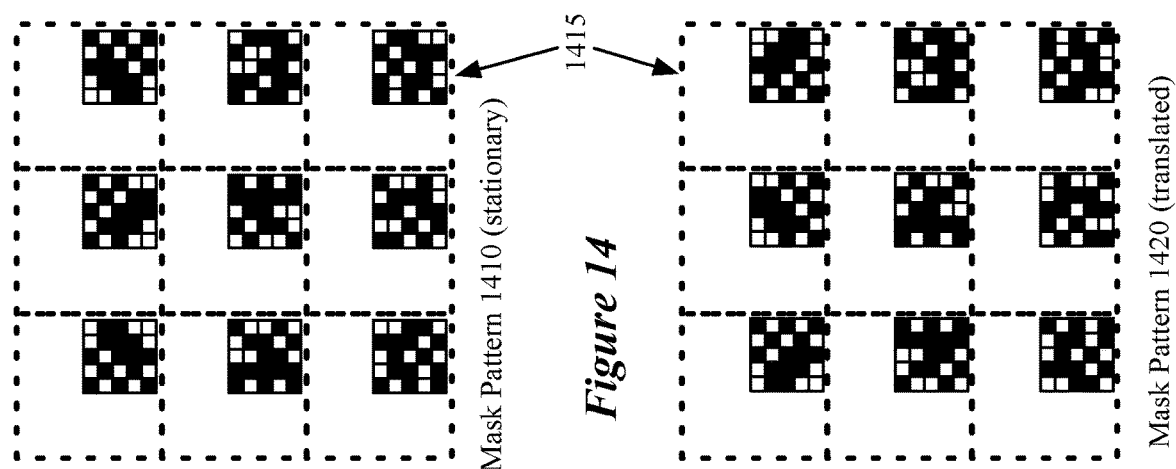

FIG. 14 illustrates an example of a plurality of passive-filter masks used to create a dynamic mask array that creates multiple superposition mask patterns through relative motion of the masks. FIG. 14 illustrates borders of individual sensors 1415 (shown as dotted lines) in a portion of a sensor array along with portions of a first passive-filter mask pattern 1410 and portions of a second passive-filter mask pattern 1420. Passive-filter mask pattern 1410 is a stationary passive-filter mask, while passive-filter mask pattern 1420 is a movable filter. In some embodiments, passive-filter mask pattern 1420 is printed on one of the sensor array, a movable lens, or lens array as described in relation to FIG. 11 or 12. Superposition mask patterns 1430-1460 represent a possible set of four masks that are generated over a lower right-hand portion of sensor areas in a sensor array.

Superposition mask pattern 1430 depicts a pattern created by the superposition of passive-filter mask patterns 1410 and 1420 in an initial position (i.e., a position defined as the origin for passive-filter mask pattern 1420 denoted by coordinates (0,0)). Superposition mask pattern 1440 depicts a pattern created by the superposition of passive-filter mask patterns 1410 and 1420 after passive-filter mask pattern 1420 has been translated to the right by one unit (e.g., position (1,0)) that, in FIG. 14, is equivalent to two pixels of the mask pattern. Superposition mask pattern 1450 depicts a pattern created by the superposition of passive-filter mask patterns 1410 and 1420 after passive-filter mask pattern 1420 has subsequently been translated down by one unit (e.g., position (1,1)). Superposition mask pattern 1450 depicts a pattern created by the superposition of passive-filter mask patterns 1410 and 1420 after passive-filter mask pattern 1420 has been translated back to the left by one unit (e.g., position (0,1)). A subsequent movement up brings the passive-filter masks into the original relative position 1430 (e.g., (0,0)) and the cycle can start again.

In some embodiments, the number and size of displacements can be arbitrarily set to match a set of mask patterns used to train the machine trained network that will be described below. The number and size of the displacements, in some embodiments, depends on the speed with which a displacement can be performed, the size of the pixelation of the passive-filter mask patterns, the required frame rate, the amount of total displacement that can be achieved, etc. For example, for a pixel size of 0.5 microns and a frame rate for video capture of 30 Hz, a particular embodiment that can perform 1 micron displacements in $\frac{1}{300}^{th}$ of a second could perform 10 displacements of 1 pixel size (0.5 microns) per frame, effectively increasing the number of basis vectors/waveforms for which data is captured by a factor of 10. In some embodiments, multiple adjustable passive masks are used in addition to the fixed passive mask or without a fixed passive mask to produce the dynamic mask pattern arrays.

Figure 15:
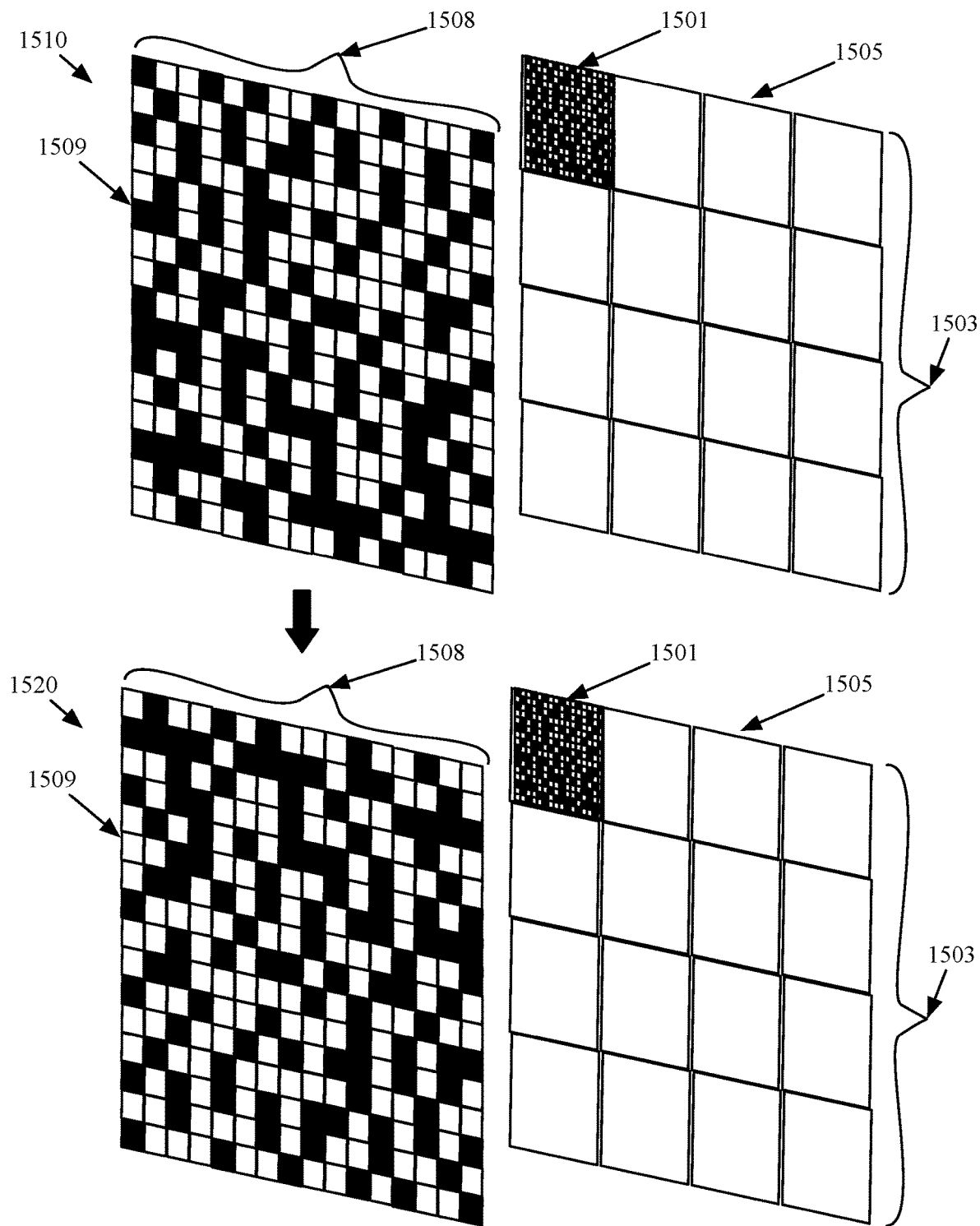
FIG. 15 illustrates an example of a sensor array combined with an active-filter mask LCD.

The dynamic mask array, in some embodiments, is a liquid crystal display used to dynamically block different areas of sensors in the sensor array. FIG. 15 illustrates an example of a sensor array 1503 combined with an active-filter mask LCD element 1508. In some embodiments, LCD element 1508 is placed in front of a sensor array 1503 in close proximity such that a set of particular controllable elements (e.g., pixels) 1509 of the LCD element are associated with a particular sensor 1505. In some embodiments, LCD element 1508 is placed in an aperture such that the mask pattern of the LCD is effectively applied to each sensor 1505 in sensor array 1503. While embodiments with both LCD element 1508 placements can be combined with passive-filter mask patterns (e.g., mask pattern 1501), some embodiments placing the LCD element 1508 in an aperture require a set of passive-filter masks 1501 to be associated with individual sensors 1505 in the sensor array 1503 to produce an acceptable number of basis vectors, functions, or waveforms.

In embodiments combining LCD element 1508 with an array of passive-filter masks 1501, a set of dynamic masks is produced by using the LCD to change the pattern of light incident on a passive-filter mask 1501 and sensor 1505 (e.g., by blocking different areas of the passive-filter masks 1501 for a particular sensor 1505 or by blocking different areas of light entering the aperture) to effectively create multiple different masks. The multiple different masks can be used to capture compressed-image data for a single scene by cycling through a set of LCD element 1508 patterns (e.g., patterns 1510 and 1520) to capture image data for each of the multiple different mask arrays. It is understood by one of ordinary skill in the art that the term single scene as used herein includes a scene capture from either of (1) a fixed camera position or (2) a shifting camera position, that captures either (1) a changing, moving, or shifting set of objects (e.g., a person walking through an area) within a view of the set of sensors, or (2) a shifting camera position and a stationary set of objects within a view of the set of sensors. For example, an LCD may be capable of refreshing at a rate of 270 Hz and can therefore generate a set of 9 patterns per image even when capturing images for video at 30 frames per second. In this example each sensor 1505 can now capture image data associated with 9 different mask patterns.

Figure 16:
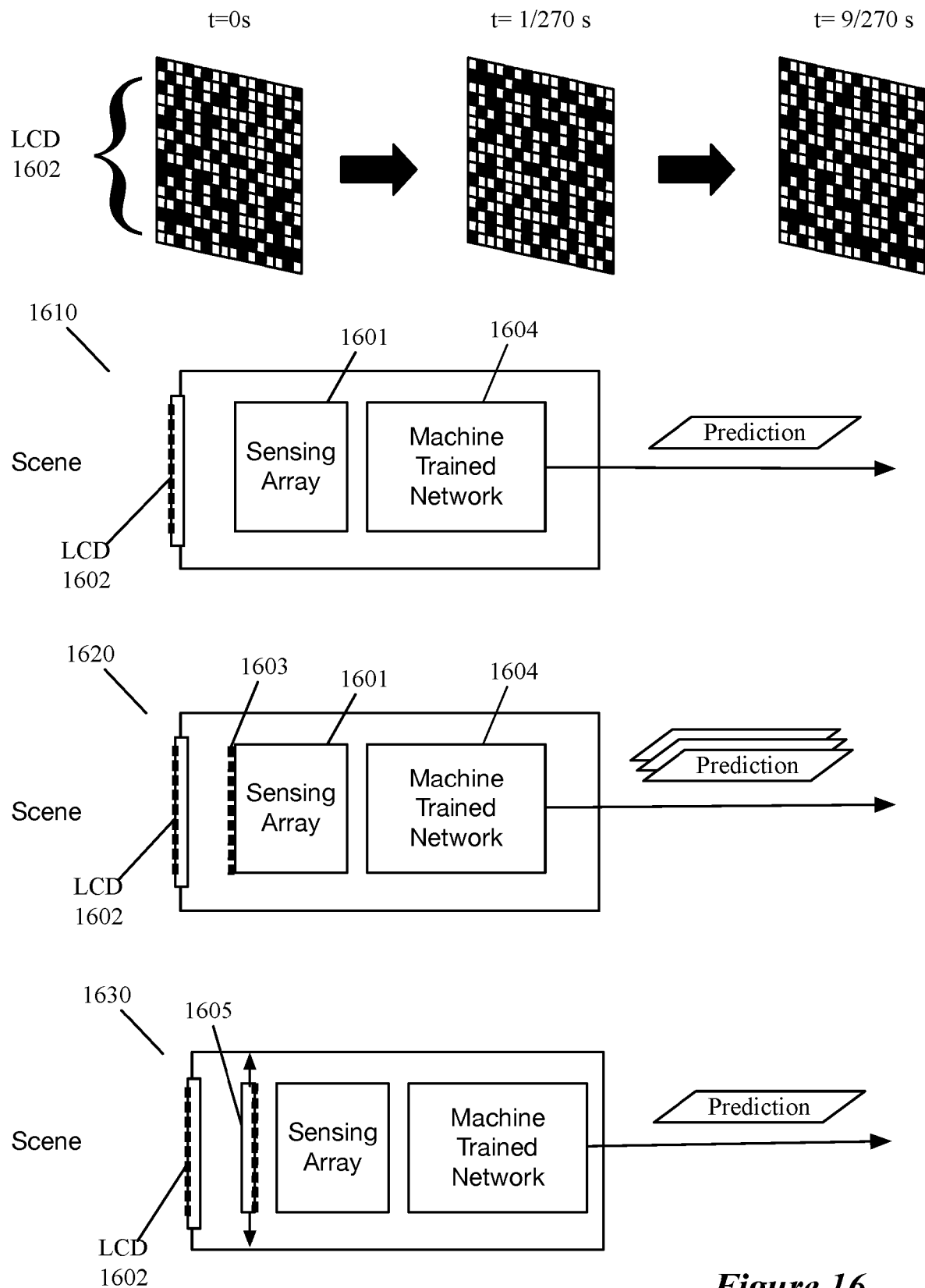
FIG. 16 illustrates multiple configurations of a novel compressive sensing device incorporating an LCD.

FIG. 16 illustrates multiple configurations 1610-1630 of a novel compressive sensing device incorporating an LCD 1602 along with sensing array 1601, machine trained network 1604, and optionally, passive-filter mask 1603 and substrate 1605. LCD 1602 is illustrated as going through a set of 9 patterns with a frequency of 270 Hz to allow for video capture at 30 Hz for each generated LCD pattern. In capturing a still image, a greater number of mask patterns may be generated and the timing may be adjusted for the specific application. Configuration 1610 illustrates a single LCD 1602 placed in an aperture before sensing array 1601.

Configurations 1620 and 1630 illustrate constructions including passive-filter mask arrays (e.g., 1603 and 1605)

that are either stationary 1620 or mobile 1630. Not shown is an embodiment incorporating a lens or focusing lens array, however both lens structures (separately) are incorporated into an LCD embodiment such as 1610 in some embodiments. Configuration 1620 illustrates a construction incorporating passive-filter mask 1603 directly on sensing array 1601 as described above for other embodiments (e.g., printed or deposited on sensors of sensing array 1601). Configuration 1630 illustrates a passive-filter mask printed on substrate 1305 which can move relative the sensors of sensing array 1601 and LCD 1602.

Figure 17:
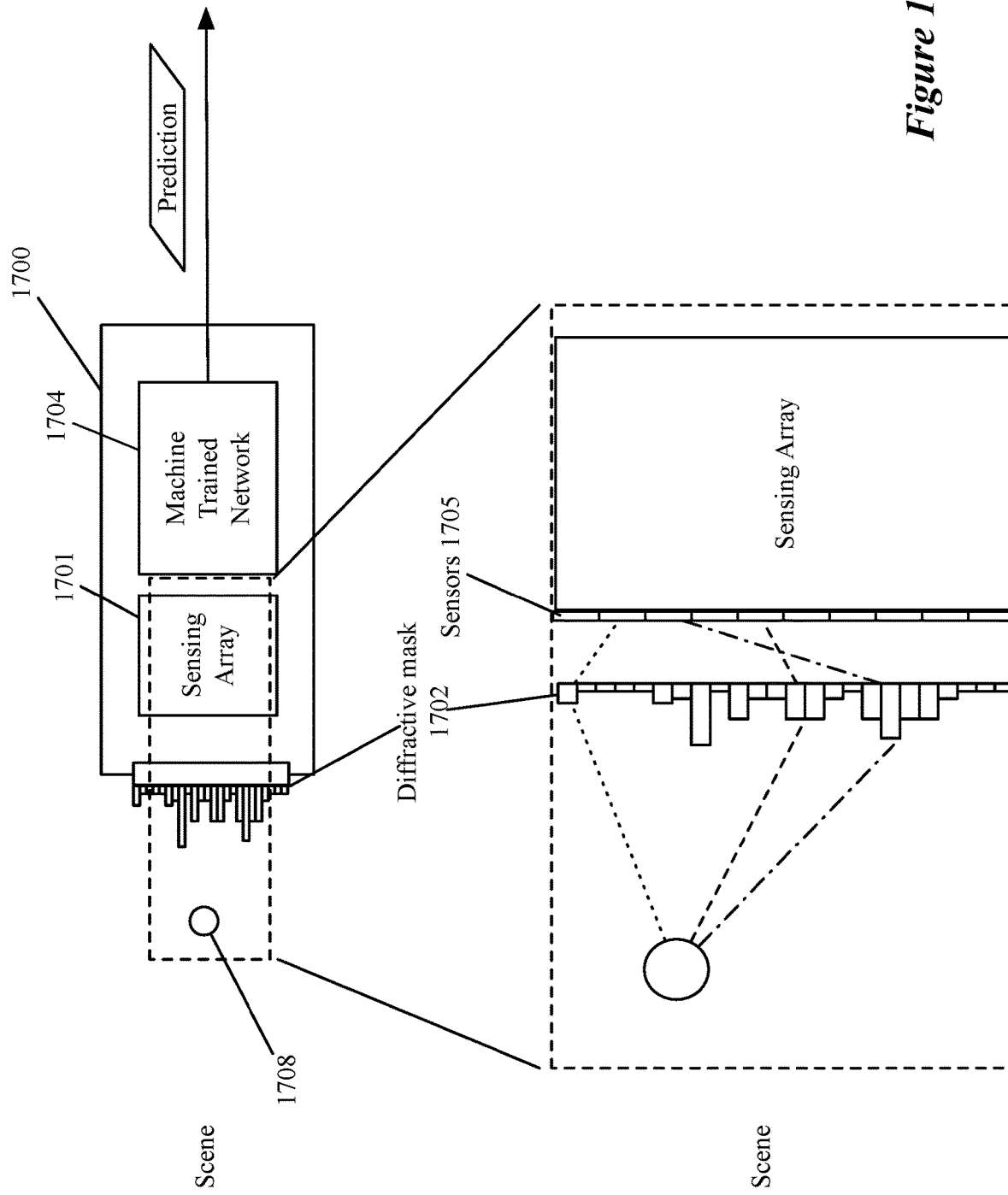
FIG. 17 illustrates a diffraction-based compressive-sensing device.

FIG. 17 illustrates a diffraction-based compressive-sensing device 1700. Device 1700 includes sensing array 1701, machine trained network 1704, and diffractive mask 1702. Diffractive mask 1702, in some embodiments, is a polymer or silicon based mask with features of different heights. In some embodiments, the features are one of squares, rectangles, triangles, hexagons, ellipses, circles, space-filling irregular polygons, or a combination of multiple types of features (e.g., squares and rectangles or hexagons and triangles). The features, in some embodiments, are of a same size (e.g., a square with a side length of 10 microns) while in other embodiments, individual features have different sizes (e.g., squares having sides ranging from 1-10 microns). A polymer-based diffractive mask 1702, in some embodiments, is formed by either molding or replicating, while a silicon-based mask, in some embodiments is formed by an etching process.

Object 1708 is depicted as part of a scene imaged by device 1700. As shown sensing array 1701 includes a set of sensors 1705. In the depicted embodiment, no additional masking is included in device 1700 as the diffractive mask directs incoming light from a same object to different sensors 1705 in the sensing array 1701. The machine trained network 1704 is trained on images captured by the sensing array through the diffractive mask 1702 and outputs a prediction or set of predictions based on the captured data. In some embodiments, the machine trained network 1704 is used to reconstruct a captured image.

Figure 18:
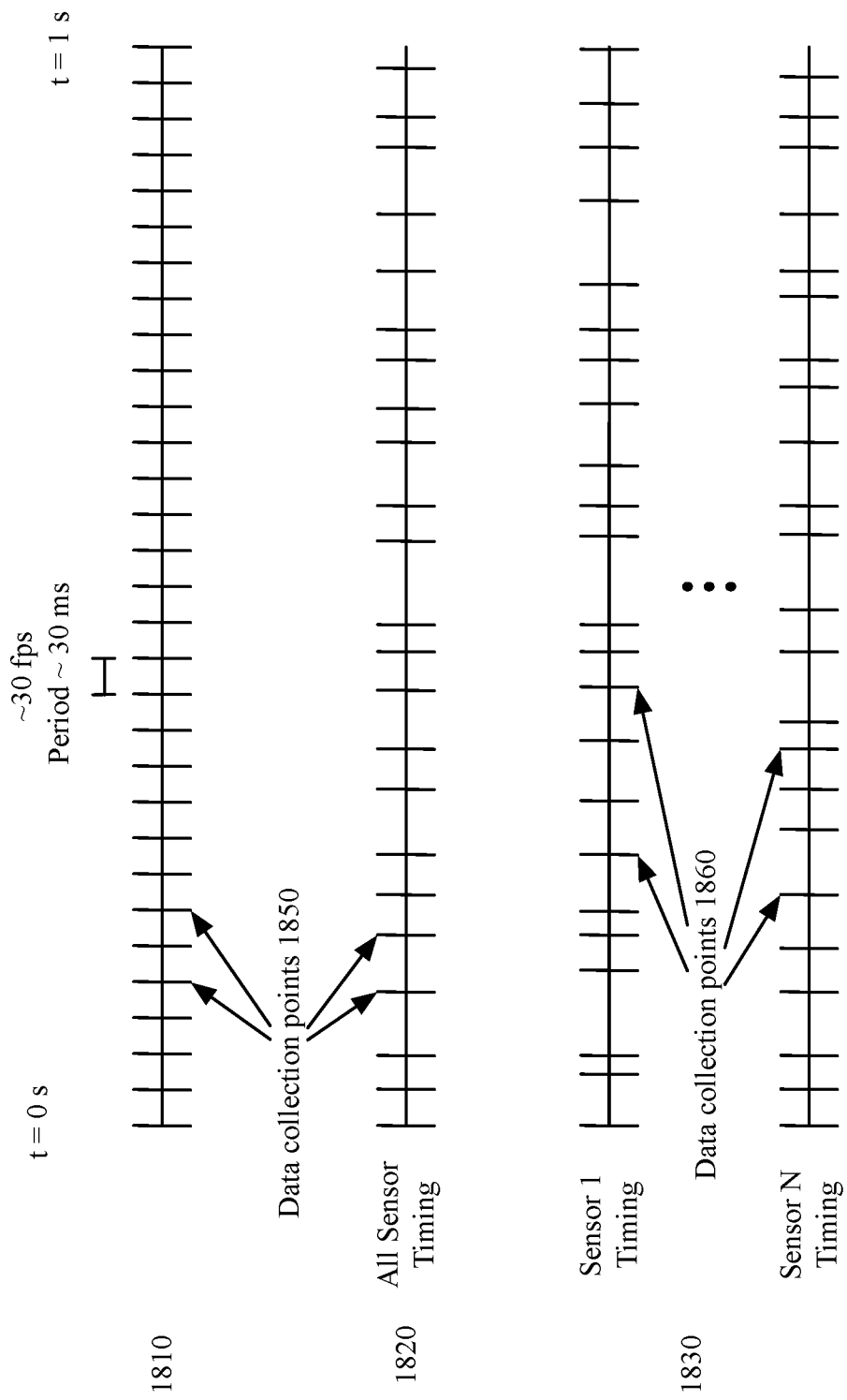
FIG. 18 illustrates an additional or alternative time-based technique for compressive sensing in video data capture.

FIG. 18 illustrates an additional or alternative time-based technique for compressive sensing in video data capture. As depicted in 1810, standard video image data capture includes sampling each sensor in a sensor array at data collection points 1850 (e.g., approximately every 30 ms for a 30 frame per second video). In order to compress data in time, some embodiments collect data at different data collection points 1850 (e.g., pseudorandom or predetermined data collection points) as in examples 1820 and 1830. Time-compressed sensing uses different intervals between data points that, on average, are larger than the standard interval for the frame rate. For example, the average time between data collection points 1850 in embodiment 1820 is approximately 40-50 ms for a 30 frame per second video capture instead of approximately 30 ms for a standard 30 frame per second video capture.

Embodiment 1830 indicates that, in some embodiments, each sensor uses a separate timing (e.g., unique to each sensor or each sensor assigned a set of timing parameters from a plurality of sets of timing parameters) including data collection points 1860. The different timing acts similarly to the passive-filter mask of the spatially compressed embodiments. In some embodiments, the time compression is combined with the spatial compression. The time compression can be combined with any of the embodiments discussed above in relation to FIGS. 8, 11, 12, 13, 16, and 17.

Figure 19:
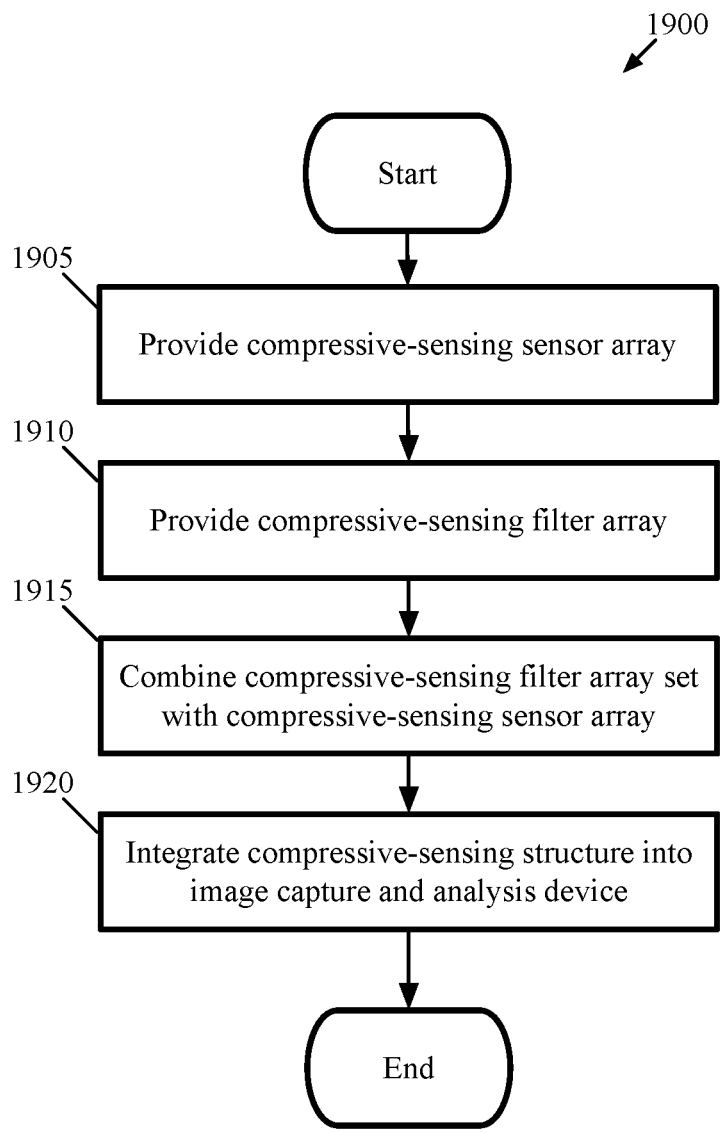
FIG. 19 conceptually illustrates a process for producing a compressive sensing image capture and analysis device.

FIG. 19 conceptually illustrates a process 1900 for producing any of the compressive sensing image capture devices described above and integrating it into an image capture and analysis device. Process 1900 begins by providing (at 1905) a compressive-sensing sensor array (e.g., sensor array 503). In some embodiments, the provided sensor array is a low cost, low resolution sensor array. For example, a 136×76 sensor (or photodiode) array is provided in some passive-filter mask embodiments. For active-mask (e.g., dynamic-mask) embodiments, the number of sensors can be reduced by the number of different masks used in capturing data for an image at a particular sensor without degrading the data.

The process continues by providing (at 1910) a compressive-sensing filter array. As described above, the filter array is either a passive-filter mask array (e.g., the arrays of FIGS. 8, 11, 12, 17) or an active-filter array (e.g., the arrays of FIGS. 13 and 16). The filter array, in some embodiments, is incorporated into a lens configuration including a single lens or an array of lenses (the lenses having any of the optical properties described above). The filter array may be printed on a substrate such as a glass or plastic sheet. In some embodiments, the filter array includes a set of unique mask patterns that are each associated with a particular sensor (pixel) in the sensor array. The filter array, in some embodiments, includes a set of mask patterns that includes multiple copies of each mask pattern in a set of unique mask patterns for redundancy or to increase signal strength (e.g., signal to noise ratios) for a particular mask pattern. In embodiments using unfocused light, copies of a particular pattern are associated with adjacent or near sensors.

After both the compressive-sensing sensor and filter arrays are provided, the compressive-sensing sensor and filter arrays are combined (at 1915) to form the basic component of the image capture device (i.e. the compressive-sensing structure). In some embodiments, the filter array is a passive-filter mask array that is printed (e.g., deposited or photolithographically built) on the sensor array, in other embodiments a passive-filter mask array is printed on a substrate (e.g., glass or transparent plastic) that is bonded to the sensor array or placed adjacent to the sensor array in some way. The substrate, in some embodiments, includes an optical element (e.g., lens or lens array) or optical element array that directs, filters, or changes the phase of the incident wave. In some embodiments, active-filter mask arrays including at least one movable passive-filter mask are combined with the sensor array by attaching the at least one passive-filter mask to a means for moving the mask in relation to at least one other passive-filter mask (e.g., a set of piezoelectric motors). Other active-filter masks, in some embodiments, include zero or more passive-filter masks that are fixed in relation to a sensor array and at least one passive-filter mask that is movable in relation to the sensor array. Active-filter mask arrays including an LCD element, in some embodiments, are combined with the sensor array by placing an LCD element in an aperture through which electromagnetic radiation (e.g. light, IR, x-ray, etc.) enters the device to be sensed by the sensors in the sensor array. In other embodiments, LCD elements are combined with the sensor array by placing the LCD element in close proximity to the sensor array such that each controllable element (e.g., pixel) of the LCD element is associated with a particular sensor in the sensor array.

The combined sensor and filter arrays are then integrated (at 1920) into an image data capture and analysis device. In some embodiments, the image data capture and analysis device includes a set of processing units that implement a machine trained network to perform analysis of the data captured for a particular image. In some embodiments, image data capture and analysis are only two features of a mobile computing device. Examples of mobile computing devices include smartphones, tablets, laptops, etc. In embodiments that include the image data capture and analysis functionality in a mobile device, the processing units implementing the MT network are general processing units that also perform general processing for other functions of the mobile device. In other embodiments, image processing is performed by an application specific integrated circuit (ASIC), or a set of general processing units (GPUs) executing an image processing program (e.g., a decompression program). Other components of a device embodiment are described with respect to FIG. 26.

The novel compressive-sensing image capture device described above is used to capture compressive-sensing image data that can be used to perform image analysis or reconstruction. For example, each sensor captures data only using areas of the sensor that are not blocked by the masks (either passive or dynamic). The pattern mask arrays, in this example, effectively perform a filtering function in the physical world that acts as a set of mathematical filtering functions. In some embodiments, data captured by the compressive-sensing image capture device may be understood as a set of coefficients associated with the different basis vectors, functions, or sampling waveforms that the different mask patterns for each sensor represent. This is in contrast to previous compressive-sensing devices that capture data for each pixel/sensor and then apply compression techniques (e.g., using a set of filter functions to reduce the image data to a set of coefficients) to reduce the amount of data stored for later analysis or reconstruction. By performing the filtering in the physical world, the compressive-sensing image capture device reduces the need for processing captured images and saves power and processing capacity.

Figure 20:
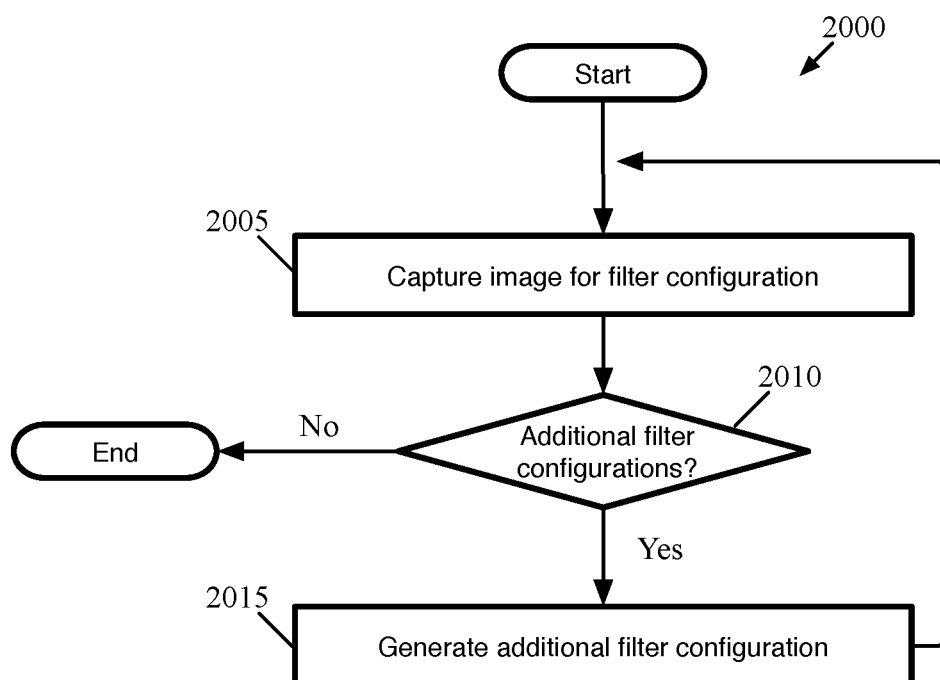
FIG. 20 conceptually illustrates a process for capturing image data using image capture devices of some embodiments.

FIG. 20 conceptually illustrates a process 2000 for capturing compressed-image data using image capture devices of some embodiments. Compressed-image data capture process 2000 begins (at 2005) by capturing data for a scene (e.g., a field of view of the device) using a filter array configuration. In some embodiments, capturing compressed-image data includes reading out a signal value (e.g., voltage) from each sensor and storing the corresponding values in a memory of the image capture device. The captured compressed-image data, in some embodiments, is for a single passive-filter mask array or for a first active-filter mask array pattern (e.g., configuration) in a series of active-filter mask array patterns (configurations). It is understood by one of ordinary skill in the art that a scene captured by an active-filter mask array as used herein includes a scene capture from either of (1) a fixed camera position or (2) a shifting camera position, that captures either (1) a changing, moving, or shifting set of objects (e.g., a person walking through an area) within a view of the set of sensors, or (2) a shifting camera position and a stationary set of objects within a view of the set of sensors and that compressed-image data associated with different configurations of the active-filter mask array may correspond to slightly shifted views or objects (due to movement of the camera, objects in the scene, or both) that is still considered a same scene for the purposes of this description and the compressed-image data processing.

After capturing compressed-image data using a particular filter configuration, the process determines whether there are additional filter configurations for which compressed-image data needs to be captured. In embodiments using a single passive-filter array, this determination is performed implicitly or may be omitted. If the process determines that there are no more filter configurations for which image data needs to be captured, the process ends and is ready to capture compressed-image data associated with a next compressed-image (e.g., image data associated with a next frame of a video).

If the process determines that there are additional filter configurations for which compressed-image data needs to be captured, the process generates (at 2015) an additional filter configuration and returns to capture (at 2005) compressed-image data associated with the generated filter configuration. In some embodiments, the additional filter configuration is generated by stepping a movable passive-filter array (or multiple arrays) to a next step in a series of steps that define a full set of filter configurations. In some embodiments employing an LCD element, the additional filter configuration is generated by changing the pattern of the controllable elements (pixels) of the LCD elements that can either block or allow electromagnetic radiation (light) to pass.

In some embodiments, a novel machine trained (MT) network is provided that is trained on image capture data captured by the novel compressive-sensing image capture device to predict solutions to problems. A basic structure of a multi-layer machine-trained network is described in relation to FIG. 21. FIGS. 22-25 describe the training and use of the trained network.

Figure 21:
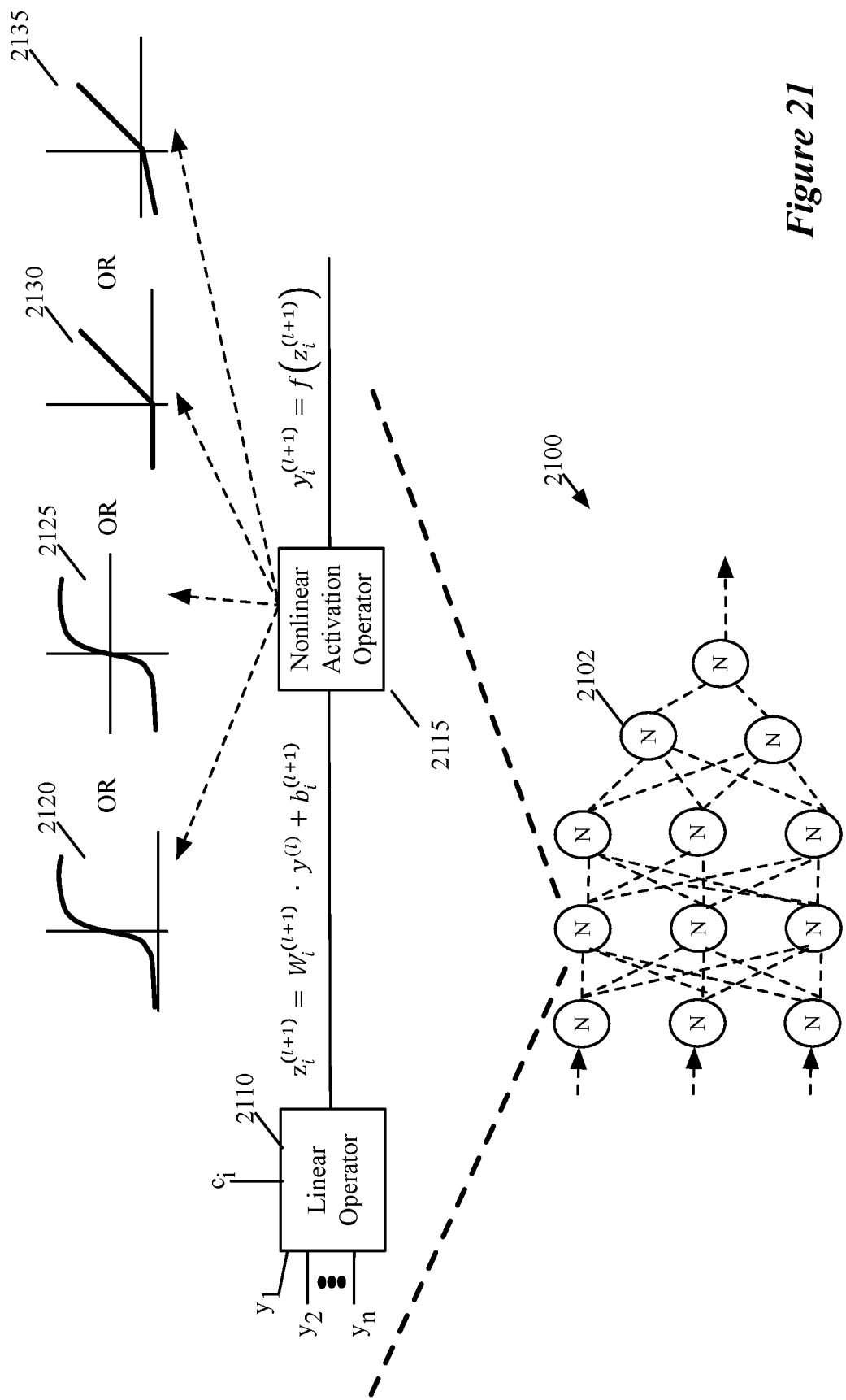
FIG. 21 illustrates a simple feed-forward neural network with three hidden layers having multiple nodes, and a single output layer with one output node.

FIG. 21 illustrates an example of a multi-layer machine-trained network of some embodiments. This figure illustrates a feedforward neural network 2100 that has multiple layers of processing nodes, called neurons 2102. In all but the first (input) and last (output) layer, each neuron 2102 receives two or more outputs of neurons from earlier processing node layers and provides its output to one or more neurons in subsequent layers. The output of the neuron in the last layer represents the output of the network 2100. In some embodiments, the output of the network 2100 is a number in a range of values (e.g., 0 to 1). In this example, the neural network 2100 only has one output node. Other neural networks of other embodiments have several output nodes that provide more than one output value. In addition, the neural networks of other embodiments may be types of networks other than feed forward networks (e.g., recurrent networks, convolutional networks, etc.).

As shown in FIG. 21, each neuron in neural network 2100 has a linear component 2110 and a nonlinear component 2115. The linear component 2110 of each hidden or output neuron in this example computes a dot product of a vector of weight coefficients and a vector of output values of prior nodes, plus an offset. In other words, a hidden or output node's linear operator computes a weighted sum of its inputs (which are outputs of the previous stage neurons that the linear operator receives) plus an offset. Similarly, the linear component 2110 of each input neuron of some embodiments computes a dot product of a vector of weight coefficients and a vector of input values, plus an offset. In other embodiments, each input neuron receives a single input and passes that input as its output. Each neuron's nonlinear component 2115 computes a function based on the output of the neuron's linear component 2110. This function is commonly referred to as the activation function.

The notation of FIG. 21 can be described as follows. Consider a neural network with L−1 hidden layers (i.e., L+1 layers including the input layer and the output layer). The variable l can be any of the hidden layers (i.e., $l \in \{1, \ldots, L-1\}$ index the hidden layers of the network, with l=0 representing the input layer and l=L representing the output layer). The variable $z_i^{(l+1)}$ represents the output of the linear component of a hidden neuron i in layer l+1. As indicated by the following Equation (A), the variable $z_i^{(l+1)}$ is computed as the dot product of a vector of weight values $W_i^{(l+1)}$, and a vector of outputs $y^{(l)}$ from layer l plus an offset $b_i$, typically referred to as a bias.

$$z_i^{(l+1)} = W_i^{(l+1)} \cdot y^{(l)} + b_i^{(l+1)} = \Sigma_{k=1}^n (w_{ik}^{(l+1)} * y_k^{(l)}) + b_i^{(l+1)} \quad (A)$$

The symbol * is an element-wise product, while the symbol • is the dot product. The weight coefficients $W^{(l)}$ are parameters that can be adjusted during the network's training in order to configure this network to solve a particular problem.

The output $y^{(l+1)}$ of the nonlinear component 2115 of a neuron in layer l+1 is a function of the neuron's linear component, and can be expressed as by Equation (B) below.

$$y_i^{(l+1)} = f(z_i^{(l+1)}) \quad (B)$$

In this equation, $f$ is the nonlinear activation function for node i. Examples of such activation functions include a sigmoid function 2120 ($f(x)=1/(1+e^{-x})$), a tanh function 2125, a ReLU (rectified linear unit) function 2130 or a leaky ReLU function 2135, as shown.

Traditionally, the sigmoid function and the tanh function have been the activation functions of choice. More recently, the ReLU function ($f(x)=\max(0, x)$) has been proposed for the activation function in order to make it easier to compute the activation function. See Nair, Vinod and Hinton, Geoffrey E., "Rectified linear units improve restricted Boltzmann machines," ICML, pp. 807-814, 2010. Even more recently, the leaky ReLU has been proposed in order to simplify the training of the processing nodes by replacing the flat section (i.e., x<0) of the ReLU function with a section that has a slight slope. See He, Kaiming, Zhang, Xiangyu, Ren, Shaoqing, and Sun, Jian, "Delving deep into rectifiers: Surpassing human-level performance on imagenet classification," arXiv preprint arXiv:1502.01852, 2015. In some embodiments, the activation functions can be other types of functions, like cup functions and periodic functions.

Equation (B) can be expressed in the following expanded format of Equation (C).

$$y_i^{(l+1)} = f(z_i^{(l+1)}) = f[(\Sigma_{k=1}^n w_{ik} * y_k) + b_i^{(l+1)}] \quad (C)$$

In this equation, $w_{ik}$ are weight values associated with the inputs $y_k$ of the neuron i in layer l+1.

Figure 22:
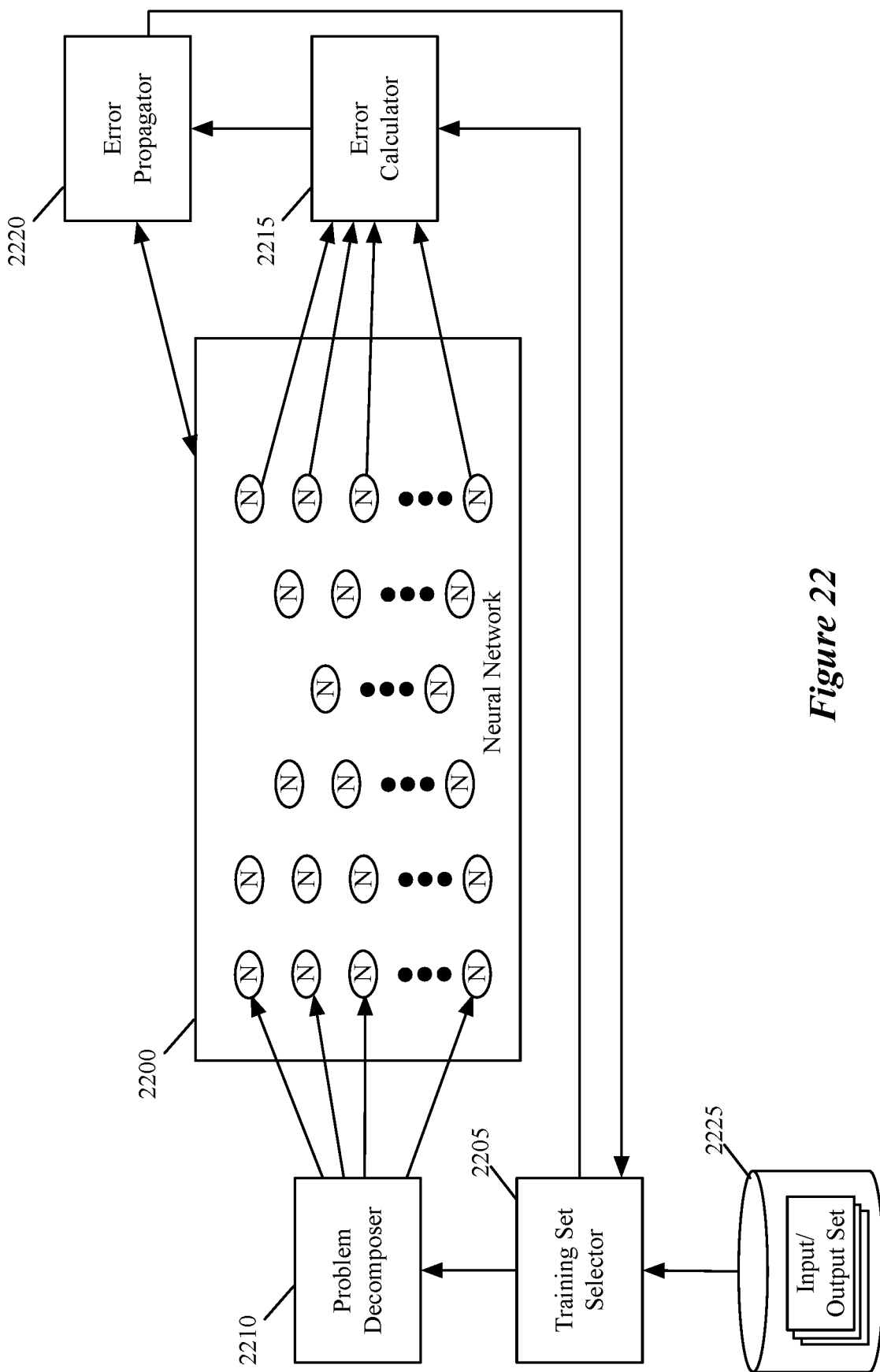
FIG. 22 illustrates a set of modules of some embodiments that perform a back propagation process that uses multiple known training sets to train the MT network.
Figure 23:
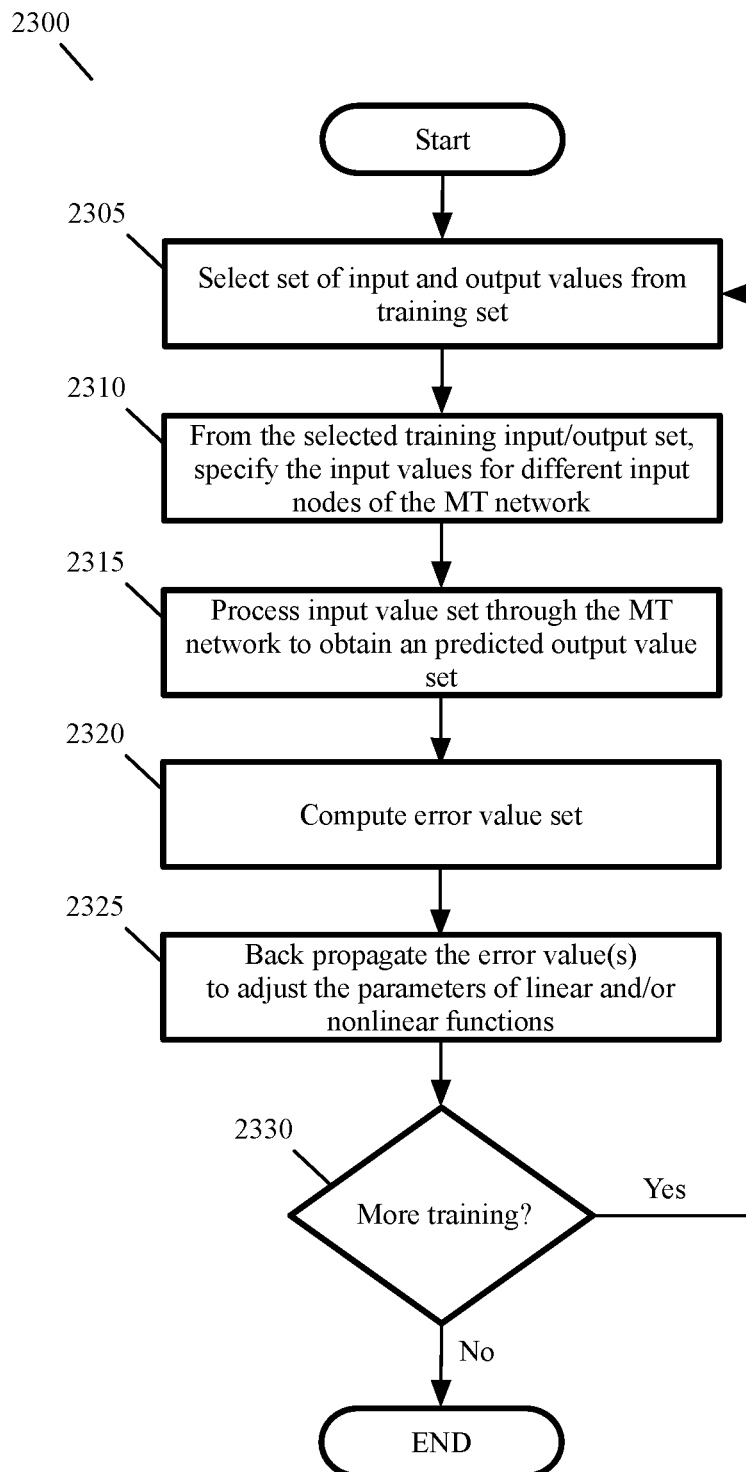
FIG. 23 illustrates the back-propagation process that the modules of FIG. 22 perform.

The MT network, in some embodiments, is a multi-layer node network trained on large numbers (e.g., 1,000-100,000) of image capture data from the novel compressive-sensing image capture device with known solutions and is trained to reproduce the known solutions given the image capture data. FIG. 22 illustrates a set of modules of some embodiments that perform a back-propagation process that uses multiple known training sets to train the MT network 2200. As shown, these modules include a training set selector 2205, an input selector 2210, an error calculator 2215, and an error propagator 2220. In some embodiments, all of these modules execute on one device, such as a mobile device (e.g., smartphone, tablet, etc.) or an IoT device. In other embodiments, these modules are performed on a different device than the device the eventually executes the MT network 2200. FIG. 23 illustrates the back-propagation process 2300 that the modules of FIG. 22 perform.

As described in FIG. 23, the training set selector 2205 initially selects (at 2305) a training set from the training sets that are stored in a data storage 2225. In some embodiments, the data storage 2225 is on the same device that executes the modules 2205-2220 of FIG. 22, while in other embodiments, this data storage is on a remote server. The selected training set includes a set of input values and a set of output values. The output value set is the set of output values that the MT network should generate for the input value set of the selected training set. In other words, the output value set is the known/desired output value set for the input value set. For example, in some embodiments, the MT network 2200 performs facial or object recognition. For these embodiments, each input/output set in the training set includes (1) captured compressed-image data (e.g., the set of sensor (pixel) values associated with the captured compressed-image) as the input value set, and (2) an object or face identifier associated with an object or face in the image as the output value set. In some embodiments, training sets are produced by a computer program that emulates the data output by a sensor array with a particular image-compressing mask (e.g., dynamic or passive image-compressing mask) placed in front of it for a particular input scene (e.g. a particular set of stationary or moving objects viewed by the sensor array from a particular point in space).

At 2310, the input selector 2210 selects the inputs to the MT network's input nodes from the set of input values selected at 2305. For example, the input selector 2210, in some embodiments, uses each individual sensor value (or set of values for dynamic pattern masks) as the input for a particular node (or set of nodes) in the set of input nodes. Next, at 2315, the MT network 2200 processes the supplied input values to produce a set of output values. In some embodiments, this processing entails each processing node of the MT network first having its linear operator 2110 compute a weighted sum of its input, and then having its nonlinear activation operator 2115 compute a function based on the output of the linear component.

At 2320, the error calculator 2215 computes a set of error values from (1) the output value set produced by the MT network for the supplied input value set, and (2) the output value set from the selected training set (selected at 2305). As shown, the error calculator 2215 receives the training set's output value(s) from the training set selector 2205 in some embodiments. In the example illustrated in FIG. 22, the MT network 2200 has multiple output processing nodes that each produce one output value. In other embodiments, the MT network produces a single value from one processing node.

For each output value in the output value set, the error calculator 2215 computes (at 2320) an error value by subtracting the MT-network produced output value from the desired output value. At 2325, the error calculator 2215 provides the error value set that it computes to the error propagator 2220, which then coordinates the back propagation of this error value set through the processing nodes of the MT network. In some embodiments, each processing node is an instantiated object that includes a back-propagation function for handling back-propagation calls from the error propagator 2220. In these embodiments, each time the error propagator 2220 calls a processing node's back-propagation function, this function computes adjustments to the parameter(s) of the node's linear operator and/or nonlinear operator and returns to the error propagator 2220 error values to propagate back to each of the inputs of the node's linear operator. To call the propagating function of a particular processing node that is not an output processing node, the error propagator 2220 in some embodiments aggregates (e.g., sums) the error values that it has receives from all processing nodes when more than one processing node receives the particular processing node's output, and then supplies the aggregated error value to the particular processing node's propagating function.

After the computed error value is back propagated through the processing nodes of the MT network and one or more of these nodes adjust their linear and/or nonlinear operator parameters during this back propagation, the error propagator 2220 notifies the training set selector 2205 that it has completed its error propagation. Next, at 2330, the training set selector 2205 determines whether it should stop the training of the MT network. In some embodiments, the training set selector 2205 uses a minimization process (e.g., a stochastic gradient descent minimizer) to determine when it should stop the training of the MT network. When the training set selector 2205 determines that it should continue the training, the process 2300 returns to 2305 to select another training set from the storage 2225, and then repeats operations 2310-2330 for this selected training set. As described above, in some embodiments, a new training set is generated instead of selected from a pre-generated set of training sets. In some embodiments, the process 2300 can iterate multiple times through one training set (i.e., one input/output set), while this process is training the configurable parameters of the MT network 2200. The process 2300 ends when the training set selector 2205 determines that it does not need to continue the training. In some embodiments, training is performed for a specific filter array configuration (e.g., training a MT network for use with a specific filter array configuration corresponding to a specific set of basis vectors, functions, or waveforms).

Figure 24:
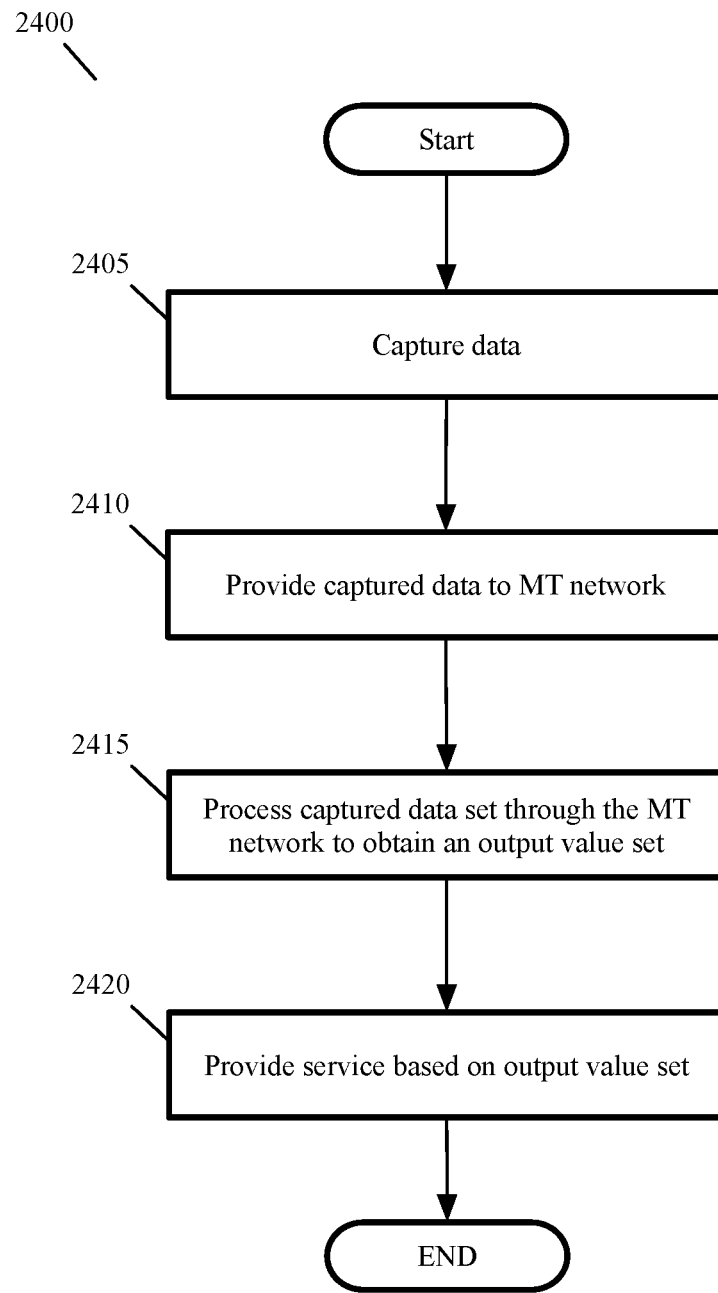
FIG. 24 conceptually illustrates a process for using the MT network in a device to produce output for captured image data and provide a service based on that output.

After training the multi-layer network, the network is loaded in a device, in some embodiments, to provide object or facial recognition capabilities or to reconstruct the captured image. FIG. 24 conceptually illustrates a process 2400 for using the MT network in a device to produce output for captured image data and provide a service based on that output. Process 2400 begins by capturing (at 2405) data from the sensor array. In some embodiments, the captured data is a vector or matrix of values associated with the individual sensors in the sensor array. The data, in some embodiments, is a vector or matrix with multiple values associated with each sensor in the sensor array, when the device uses active filtering and captures multiple values associated with each sensor for a single dataset.

The process then provides (at 2410) the captured data to the machine trained network for processing. In some embodiments, providing the captured data includes processing the data to put it into a format accepted by the machine-trained network. After the captured data is in the proper format to be processed by the machine-trained network, the process processes (at 2415) the captured data set through the machine-trained network to produce an output value set. The output value set, in different embodiments, is one of an object or facial identifier that identifies an object or face in the image capture data.

After the captured data is processed by the machine-trained network, the process provides (at 2420) a service based on the output value set. In some embodiments, the service provided is a security service that allows access to a device based on a set of allowed faces. In other embodiments, the service provided is a notification based on an identified object or person (e.g., a message is sent to a user from a security camera embodiment indicating that the user's child is at the house).

Figure 25:
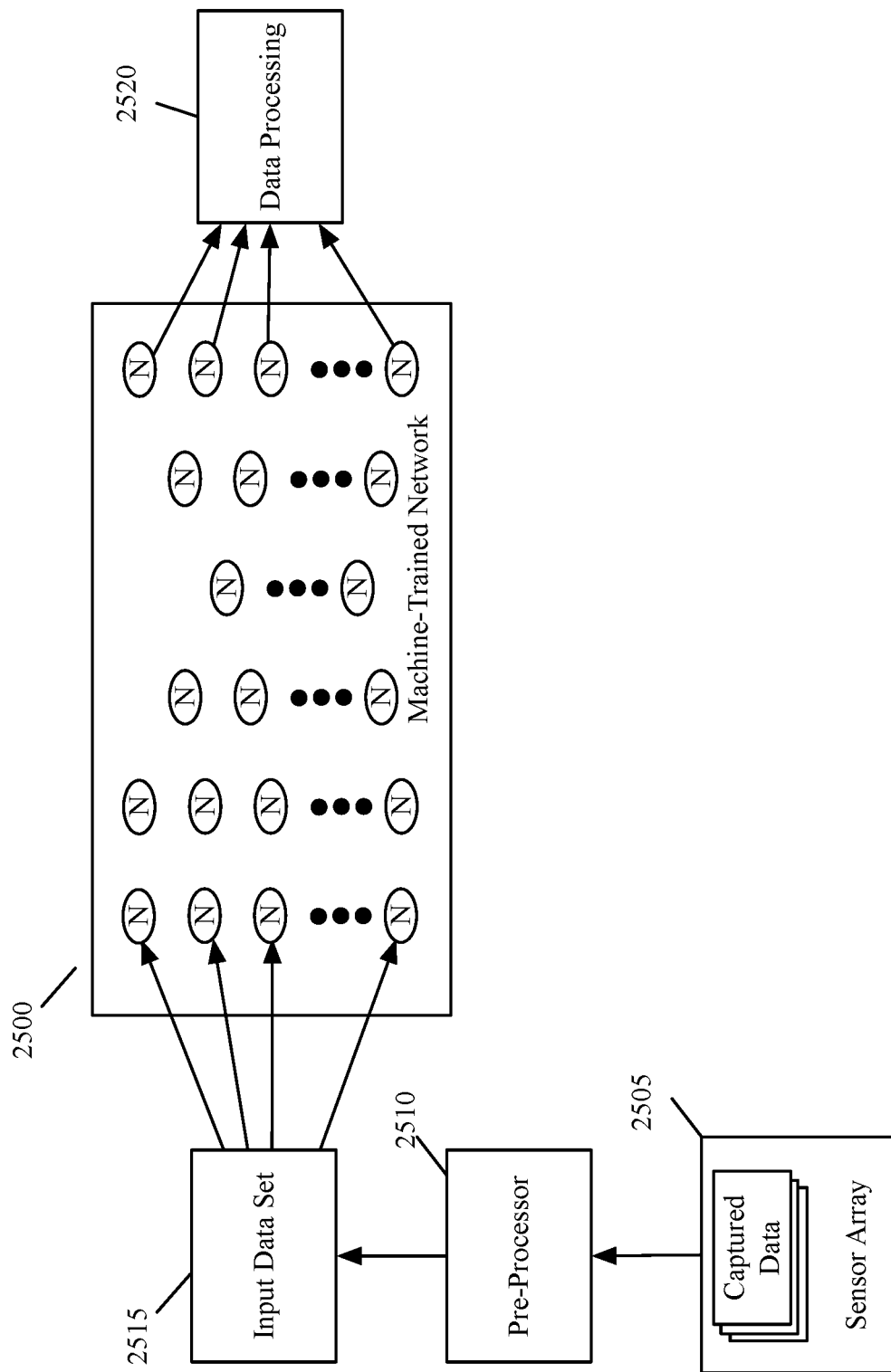
FIG. 25 illustrates a system using a machine-trained network to compute an output value set from data captured by a sensor array.

FIG. 25 illustrates a system using a machine-trained network to compute an output value set from data captured by a compressive-sensing image capture assembly. FIG. 25 includes MT network 2500, a sensor array 2505, a pre-processor 2510, an input data set 2515 and a data processing unit 2520. As described in relation to FIG. 24, sensor array 2505 captures data that is passed to pre-processor 2510. Pre-processor 2510 takes the raw data set and converts it into a form that is acceptable to MT network 2500. Once input data set 2515 is in the proper format, it is fed to MT network 2500 as input data and MT network 2500 processes the input data set to produce the output value set. The output value set is then passed to data processing module 2520. As described above, data processing module in some embodiments uses the output value set to perform additional services based on the output value set.

By using input data from the novel compressive-sensing image capture device, the amount of data the MT network must process is reduced and a simpler MT network structure than is used in processing traditional image data is capable of processing the data. For example, when the MT network is a neural network, using input data from the novel compressive-sensing image capture device allows the use of a MT neural network without any convolution layers in some embodiments, with only one convolution layer in other embodiments, and with only two convolution layers in still other embodiments.

By eliminating the convolution layers or drastically reducing their number, the method can employ a neural network that uses a fraction of the processing time, size and power of traditional neural networks. This makes the method ideal for implementation on device with more limited processing and memory resources. Examples of such devices include desktops, laptops, mobile devices (e.g., smartphones, tablets, etc.), and IoT (Internet of Things) devices. In some embodiments, such a device has the novel compressive-sensing image capture device incorporated into the device to capture the set of input values for the MT network.

Figure 26:
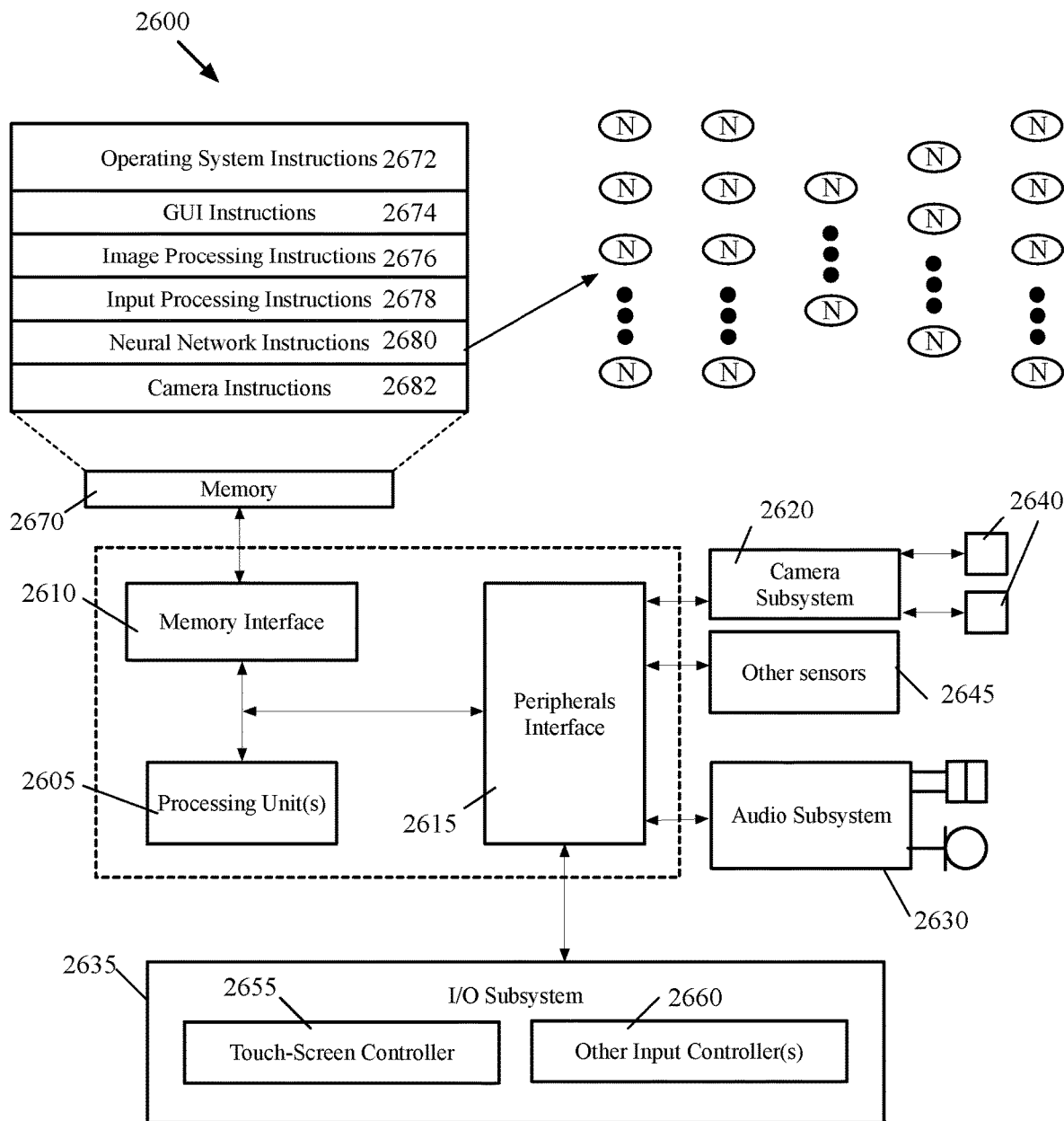
FIG. 26 illustrates an example of an architecture of a mobile computing device that stores neural network processing instructions, and multiple sub-networks that can be loaded into the processor for different purposes.

FIG. 26 is an example of an architecture 2600 of a mobile computing device that stores neural network processing instructions, and multiple sub-networks that can be loaded into the processor for different purposes. Examples of mobile computing devices include smartphones, tablets, laptops, etc. As shown, the mobile computing device 2600 includes one or more processing units 2605, a memory interface 2610 and a peripherals interface 2615.

The peripherals interface 2615 is coupled to various sensors and subsystems, including a camera subsystem 2620, an audio subsystem 2630, an I/O subsystem 2635, and other sensors 2645 (e.g., motion sensors), etc. The peripherals interface 2615 enables communication between the processing units 2605 and various peripherals. For example, an orientation sensor (e.g., a gyroscope) and an acceleration sensor (e.g., an accelerometer) can be coupled to the peripherals interface 2615 to facilitate orientation and acceleration functions. The camera subsystem 2620 is coupled to one or more optical sensors 2640 (e.g., a charged coupled device (CCD) optical sensor, a complementary metal-oxide-semiconductor (CMOS) optical sensor, etc.). The camera subsystem 2620 and the optical sensors 2640 facilitate camera functions, such as image and/or video data capturing. The compressive-sensing image capture assembly is included in device 2600 in addition to, or included as part of, camera subsystem 2620.

The audio subsystem 2630 couples with a speaker to output audio (e.g., to output voice navigation instructions). Additionally, the audio subsystem 2630 is coupled to a microphone to facilitate voice-enabled functions, such as voice recognition (e.g., for searching), digital recording, etc. The I/O subsystem 2635 involves the transfer between input/output peripheral devices, such as a display, a touch screen, etc., and the data bus of the processing units 2605 through the peripherals interface 2615. The I/O subsystem 2635 includes a touch-screen controller 2655 and other input controllers 2660 to facilitate the transfer between input/output peripheral devices and the data bus of the processing units 2605. The touch-screen controller couples with a touch screen (not shown) to detect contact and movement on the touch screen using any of multiple touch sensitivity technologies. The other input controllers 2660 are coupled to other input/control devices, such as one or more buttons.

In some embodiments, the device includes wireless communication subsystem (not shown in FIG. 26) to establish wireless communication functions. In some embodiments, the wireless communication subsystem includes radio frequency receivers and transmitters, and/or optical receivers and transmitters. These receivers and transmitters of some embodiments are implemented to operate over one or more communication networks such as a GSM network, a Wi-Fi network, a Bluetooth network, etc.

The memory interface 2610 is coupled to memory 2670. In some embodiments, the memory 2670 includes volatile memory (e.g., high-speed random access memory), non-volatile memory (e.g., flash memory), a combination of volatile and non-volatile memory, and/or any other type of memory. As illustrated in FIG. 26, the memory 2670 stores an operating system (OS) 2672. The OS 2672 includes instructions for handling basic system services and for performing hardware dependent tasks.

The memory 2670 also stores various sets of instructions, including (1) graphical user interface instructions 2674 to facilitate graphic user interface processing; (2) image processing instructions 2676 to facilitate image-related processing and functions; (3) input processing instructions 2678 to facilitate input-related (e.g., touch input) processes and functions; and (4) camera instructions 2682 to facilitate camera-related processes and functions. The processing units 2610 execute the instructions stored in the memory 2670 in some embodiments.

In addition, the memory 2670 stores neural network instructions 2680, for implementing the machine-trained network of some embodiments of the invention. The memory also stores a set of weight values for an audio-processing network and a set of weight values for an image-processing network in some embodiments.

The memory 2670 further stores communication instructions to facilitate communicating with one or more additional devices. The instructions described above are merely exemplary and the memory 2670 includes additional and/or other instructions in some embodiments. For instance, the memory for a smartphone may include phone instructions to facilitate phone-related processes and functions. The above-identified instructions need not be implemented as separate software programs or modules. Various functions of the mobile computing device can be implemented in hardware and/or in software, including in one or more signal processing and/or application specific integrated circuits. The memory 2670 may represent multiple different storages available on the device 2600.

While the components illustrated in FIG. 26 are shown as separate components, one of ordinary skill in the art will recognize that two or more components may be integrated into one or more integrated circuits. In addition, two or more components may be coupled together by one or more communication buses or signal lines. Also, while many of the functions have been described as being performed by one component, one of ordinary skill in the art will realize that the functions described with respect to FIG. 26 may be split into two or more integrated circuits.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 27:
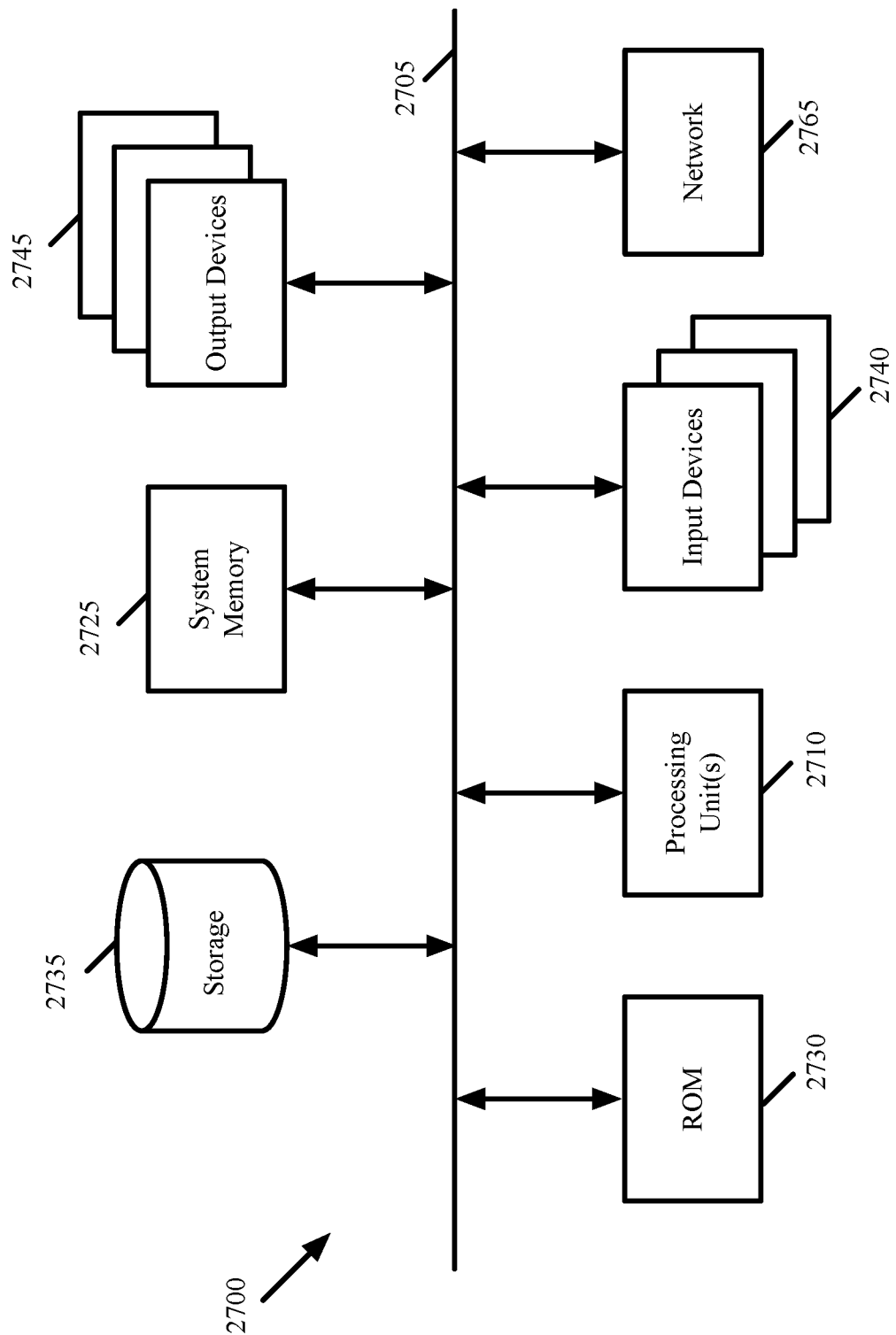
FIG. 27 conceptually illustrates an electronic system with which some embodiments of the invention are implemented.

FIG. 27 conceptually illustrates an electronic system 2700 with which some embodiments of the invention are implemented. The electronic system 2700 can be used to execute any of the control, virtualization, or operating system applications described above. The electronic system 2700 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 2700 includes a bus 2705, processing unit(s) 2710, a system memory 2725, a read-only memory 2730, a permanent storage device 2735, input devices 2740, and output devices 2745.

The bus 2705 collectively represents all system, peripheral, and chipset buses that communicatively connect the numerous internal devices of the electronic system 2700. For instance, the bus 2705 communicatively connects the processing unit(s) 2710 with the read-only memory 2730, the system memory 2725, and the permanent storage device 2735.

From these various memory units, the processing unit(s) 2710 retrieves instructions to execute and data to process in order to execute the processes of the invention. The processing unit(s) may be a single processor or a multi-core processor in different embodiments.

The read-only-memory (ROM) 2730 stores static data and instructions that are needed by the processing unit(s) 2710 and other modules of the electronic system. The permanent storage device 2735, on the other hand, is a read-and-write memory device. This device is a non-volatile memory unit that stores instructions and data even when the electronic system 2700 is off. Some embodiments of the invention use a mass-storage device (such as a magnetic or optical disk and its corresponding disk drive) as the permanent storage device 2735.

Other embodiments use a removable storage device (such as a floppy disk, flash drive, etc.) as the permanent storage device. Like the permanent storage device 2735, the system memory 2725 is a read-and-write memory device. However, unlike storage device 2735, the system memory is a volatile read-and-write memory, such a random access memory. The system memory stores some of the instructions and data that the processor needs at runtime. In some embodiments, the invention's processes are stored in the system memory 2725, the permanent storage device 2735, and/or the read-only memory 2730. From these various memory units, the processing unit(s) 2710 retrieves instructions to execute and data to process in order to execute the processes of some embodiments.

The bus 2705 also connects to the input and output devices 2740 and 2745. The input devices enable the user to communicate information and select commands to the electronic system. The input devices 2740 include alphanumeric keyboards and pointing devices (also called "cursor control devices"). The output devices 2745 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 27, bus 2705 also couples electronic system 2700 to a network 2765 through a network adapter (not shown). In this manner, the computer can be a part of a network of computers (such as a local area network ("LAN"), a wide area network ("WAN"), or an Intranet, or a network of networks, such as the Internet. Any or all components of electronic system 2700 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

While the invention has been described with reference to numerous specific details, one of ordinary skill in the art will recognize that the invention can be embodied in other specific forms without departing from the spirit of the invention. One of ordinary skill in the art would understand that the invention is not to be limited by the foregoing illustrative details, but rather is to be defined by the appended claims.

What is claimed is:

1. A method for capturing compressed-image data related to a scene, the method comprising:
   directing light captured in a first image capture event towards a set of image-capture sensors;
   passing the captured light of the first image capture event through an image-compressing mask in a first configuration before the captured light of the first image capture event reaches the set of image-capture sensors;
   modifying the image-compressing mask to produce a second configuration of the image-compressing mask;
   directing light captured in a second image capture event towards the set of image-capture sensors; and
   passing the captured light of the second image capture event through the image-compressing mask in the second configuration before the captured light of the second image capture event reaches the set of image-capture sensors,
   wherein compressed-image values produced by the sensor set are provided to an image processing circuit comprising a machine trained (MT) network of processing nodes for the MT network to identify the content of the compressed-image data related to the scene.

2. The method of claim 1, wherein the image-compressing mask comprises a fixed masking element associated with the sensors of the set of image-capture sensors.

3. The method of claim 1, wherein the image-compressing mask comprises a liquid crystal display (LCD) mask comprising a plurality of regions, wherein modifying the image-compressing mask comprises modifying a pattern of occluding and transparent regions of the LCD mask used in the first configuration to produce the second image-compressing mask configuration.

4. The method of claim 3, wherein the image-compressing mask further comprises a set of lenses, wherein each sensor of the set of image-capture sensors is associated with a particular lens in the set of lenses, each particular lens focusing light passing through the transparent regions of the LCD mask onto the sensor associated with the lens.

5. A method for capturing compressed-image data related to a scene, the method comprising:
   directing light captured in a first image capture event towards a set of image-capture sensors;
   passing the captured light of the first image capture event through an image-compressing mask in a first configuration before the captured light of the first image capture event reaches the set of image-capture sensors;
   modifying the image-compressing mask to produce a second configuration of the image-compressing mask;

directing light captured in a second image capture event towards the set of image-capture sensors; and passing the captured light of the second image capture event through the image-compressing mask in the second configuration before the captured light of the second image capture event reaches the set of image-capture sensors, wherein compressed-image values produced by the image-capture sensor set are used to produce an output based on the compressed-image values, wherein the compressed-image values produced by the set of image-capture sensors are a set of compressed-image coefficients that are output values produced by the set of image-capture sensors and are associated with a set of basis functions, each basis function representing a particular sampling of areas of a scene captured as a compressed image, wherein each masking pattern produced by the image-compressing mask comprises a plurality of patterns of occluded and transparent portions, each pattern associated with a sensor in the set of image-capture sensors, each pattern physically representing one basis function associated with the sensor, wherein a set of output values of each sensor in the set of image-capture sensors is a measurement of light incident on the sensor through a set of particular image-compressing mask configurations that is interpreted as a subset of the set of compressed-image coefficients that is equivalent to the result of a projection of an image of the captured scene onto the basis function associated with the sensor for the particular image-compressing mask configuration.

6. The method of claim 5, wherein the output is an uncompressed image that is based on the compressed-image values.

7. The method of claim 5, wherein the output is a prediction based on the compressed-image values.

8. The method of claim 5, wherein the set of image-capture sensors comprises 100 to 10,000 individual sensors and the output values of the set of image-capture sensors are used to reproduce an image equivalent to an image captured by an image capture device with more than 1 million sensors.

9. A non-transitory machine readable medium storing a program for execution by a set of processing units, the program for capturing compressed-image data related to a scene, the program comprising sets of instructions for:

causing light captured in a first image capture event to be directed towards a set of image-capture sensors;

causing the captured light of the first image capture event to be passed through an image-compressing mask in a first configuration before the captured light of the first image capture event reaches the set of image-capture sensors;

modifying the image-compressing mask to produce a second configuration of the image-compressing mask;

causing light captured in a second image capture event to be directed towards the set of image-capture sensors; and causing the captured light of the second image capture event to be passed through the image-compressing mask in the second configuration before the captured light of the second image capture vent reaches the set of image-capture sensors, wherein compressed-image values produced by the sensor set are provided to an image processing circuit comprising a machine trained (MT) network of processing nodes for the MT network to identify the content of the compressed-image data related to the scene.

10. The non-transitory machine readable medium of claim 9, wherein the image-compressing mask comprises a fixed masking element associated with the sensors of the set of image-capture sensors.

11. The non-transitory machine readable medium of claim 9, wherein the image-compressing mask comprises a liquid crystal display (LCD) mask comprising a plurality of regions, wherein the set of instructions for modifying the image-compressing mask comprises a set of instructions for modifying a pattern of occluding and transparent regions of the LCD mask used in the first configuration to produce the second image-compressing mask configuration.

12. The non-transitory machine readable medium of claim 11, wherein the image-compressing mask further comprises a set of lenses, wherein each sensor of the set of image-capture sensors is associated with a particular lens in the set of lenses, each particular lens focusing light passing through the transparent regions of the LCD mask onto the sensor associated with the lens.

13. A non-transitory machine readable medium storing a program for execution by a set of processing units, the program for capturing compressed-image data related to a scene, the program comprising sets of instructions for:

causing light captured in a first image capture event to be directed towards a set of image-capture sensors;

causing the captured light of the first image capture event to be passed through an image-compressing mask in a first configuration before the captured light of the first image capture event reaches the set of image-capture sensors;

modifying the image-compressing mask to produce a second configuration of the image-compressing mask;

causing light captured in a second image capture event to be directed towards the set of image-capture sensors; and causing the captured light of the second image capture event to be passed through the image-compressing mask in the second configuration before the captured light of the second image capture event reaches the set of image-capture sensors, wherein compressed-image values produced by the image-capture sensor set are used to produce an output based on the compressed-image values, wherein the compressed-image values produced by the set of image-capture sensors are a set of compressed-image coefficients that are output values produced by the set of image-capture sensors and are associated with a set of basis functions, each basis function representing a particular sampling of areas of a scene captured as a compressed image, wherein each masking pattern produced by the image-compressing mask comprises a plurality of patterns of occluded and transparent portions, each pattern associated with a sensor in the set of image-capture sensors, each pattern physically representing one basis function associated with the sensor, and wherein a set of output values of each sensor in the set of image-capture sensors is a measurement of light incident on the sensor through a set of particular image-compressing mask configurations that is interpreted as a subset of the set of compressed-image coefficients that is equivalent to the result of a projection of an image of the captured scene onto the basis function associated with the sensor for the particular image-compressing mask configuration.

14. The non-transitory machine readable medium of claim 13, wherein the output is an uncompressed image that is based on the compressed-image values.

15. The non-transitory machine readable medium of claim 13, wherein the output is a prediction based on the compressed-image values.

16. The non-transitory machine readable medium of claim 13, wherein the set of image-capture sensors comprises 100 to 10,000 individual sensors and the output values of the set of image-capture sensors are used to reproduce an image equivalent to an image captured by an image capture device with more than 1 million sensors.

\* \* \* \* \*